United States Patent
Lee et al.

(10) Patent No.: US 12,193,280 B1
(45) Date of Patent: Jan. 7, 2025

(54) HIGH RESOLUTION ADVANCED OLED SUB-PIXEL CIRCUIT AND PATTERNING METHOD

(71) Applicant: Applied Materials, Inc., Santa Clara, CA (US)

(72) Inventors: Jungmin Lee, Santa Clara, CA (US); Dieter Haas, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/746,747

(22) Filed: Jun. 18, 2024

Related U.S. Application Data

(60) Provisional application No. 63/645,409, filed on May 10, 2024, provisional application No. 63/608,038, filed on Dec. 8, 2023.

(51) Int. Cl.
| | |
|---|---|
| *H10K 59/122* | (2023.01) |
| *H10K 59/35* | (2023.01) |
| *H10K 59/80* | (2023.01) |
| *H10K 71/20* | (2023.01) |
| *H10K 102/00* | (2023.01) |

(52) U.S. Cl.
CPC ..... *H10K 59/122* (2023.02); *H10K 59/80515* (2023.02); *H10K 59/873* (2023.02); *H10K 71/233* (2023.02); *H10K 59/35* (2023.02); *H10K 2102/351* (2023.02)

(58) Field of Classification Search
CPC .... H10K 59/122; H10K 59/35; H10K 59/873; H10K 59/80515; H10K 71/233; H10K 2102/351
See application file for complete search history.

(56) References Cited

U.S. PATENT DOCUMENTS

| | | | |
|---|---|---|---|
| 9,634,074 B2 | 4/2017 | Son et al. | |
| 11,348,983 B1 | 5/2022 | Choung et al. | |
| 11,552,143 B1 | 1/2023 | Choung et al. | |
| 2012/0217516 A1 | 8/2012 | Hatano et al. | |
| 2016/0043341 A1* | 2/2016 | Heo | H10K 59/122 |
| | | | 438/23 |

(Continued)

FOREIGN PATENT DOCUMENTS

| | | |
|---|---|---|
| KR | 1020070056566 A | 6/2007 |
| KR | 1020200049115 A | 5/2020 |

*Primary Examiner* — Nduka E Ojeh
(74) *Attorney, Agent, or Firm* — Patterson + Sheridan, LLP

(57) ABSTRACT

Embodiments described herein generally relate to a display. In one or more embodiments, a sub-pixel circuit includes at least two anodes disposed over a substrate. Adjacent anodes define a well. Adjacent overhang structures are disposed in the well. The overhang structures have an overhang thickness from the substrate to an upper surface of the overhang structures. The overhang thickness and the anode thickness are substantially equivalent. The overhang structures include overhang extensions extending past lower sidewalls. The well has a trench area defined by the lower sidewalls and a bottom surface of the overhang extensions, with a gap between the overhang extensions of the adjacent overhang structures. An organic light emitting diode (OLED) material is disposed over the anode, the upper surface of the overhang structures, under the overhang structures, and within the trench area. A cathode is disposed over the OLED material.

30 Claims, 14 Drawing Sheets

(56) References Cited

U.S. PATENT DOCUMENTS

| | | | |
|---|---|---|---|
| 2016/0079325 A1* | 3/2016 | Lee | H10K 71/00 438/26 |
| 2021/0200357 A1 | 7/2021 | Lee et al. | |
| 2022/0102448 A1 | 3/2022 | Liu et al. | |
| 2022/0123075 A1 | 4/2022 | Kim et al. | |
| 2022/0344417 A1* | 10/2022 | Choung | H10K 71/16 |

* cited by examiner

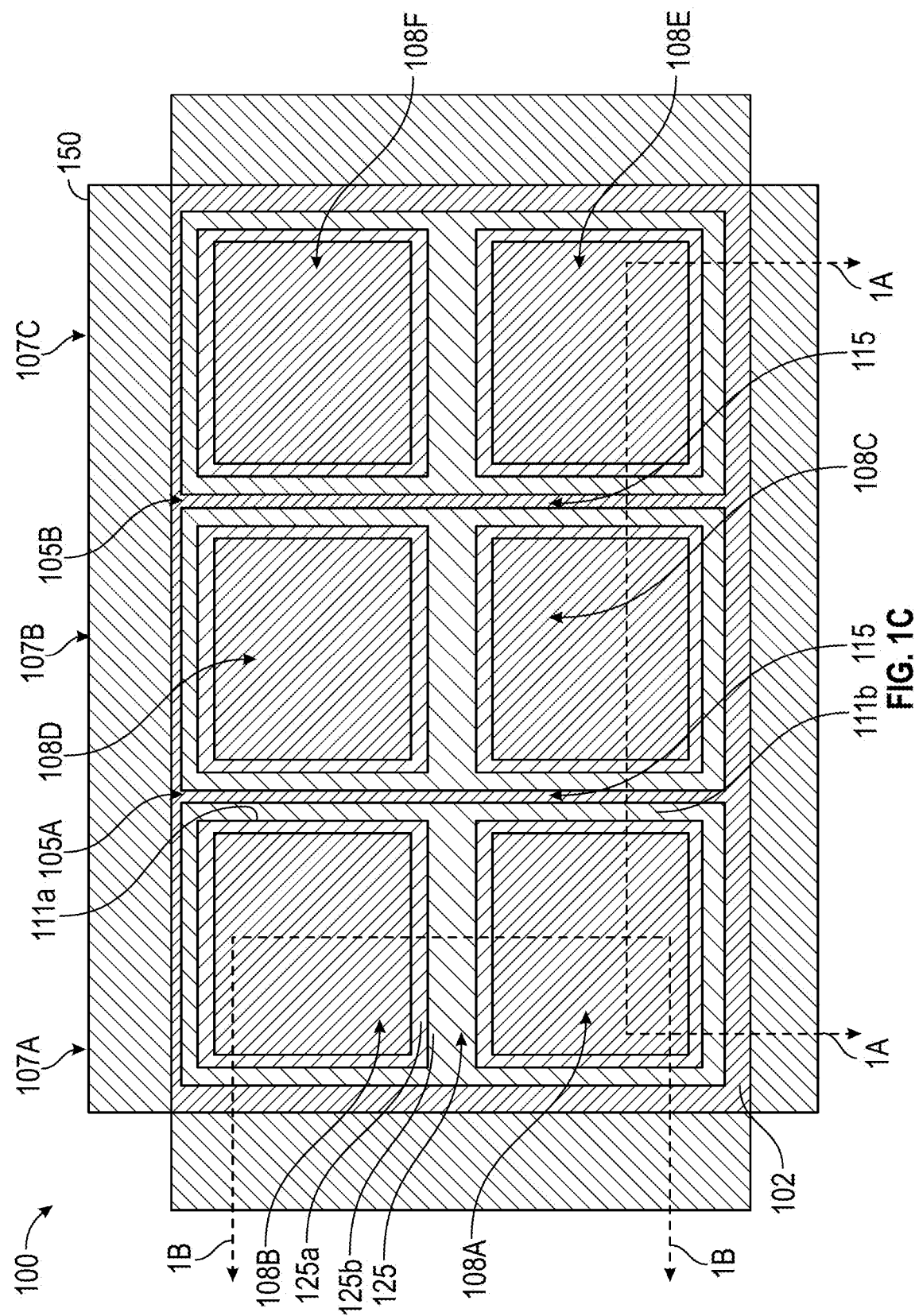

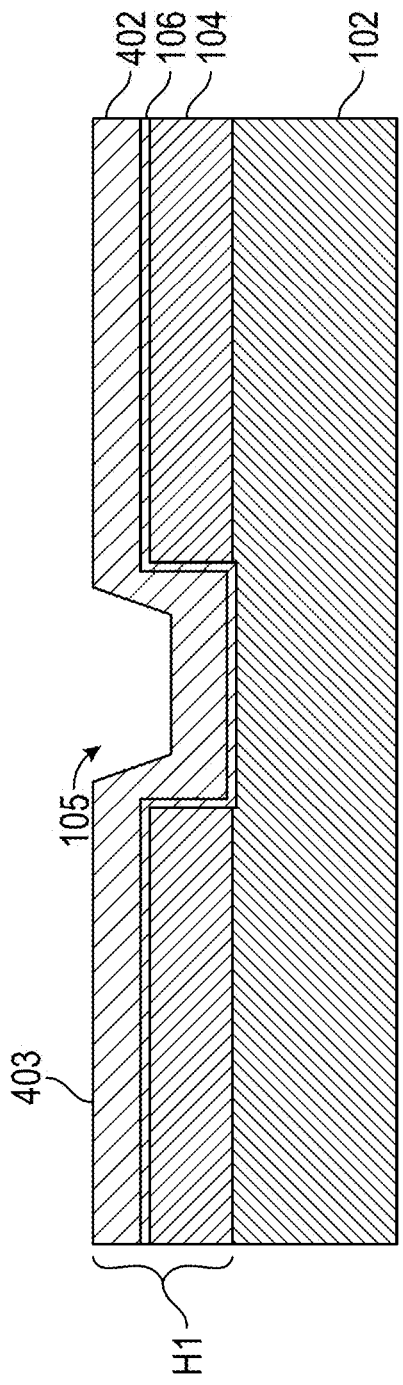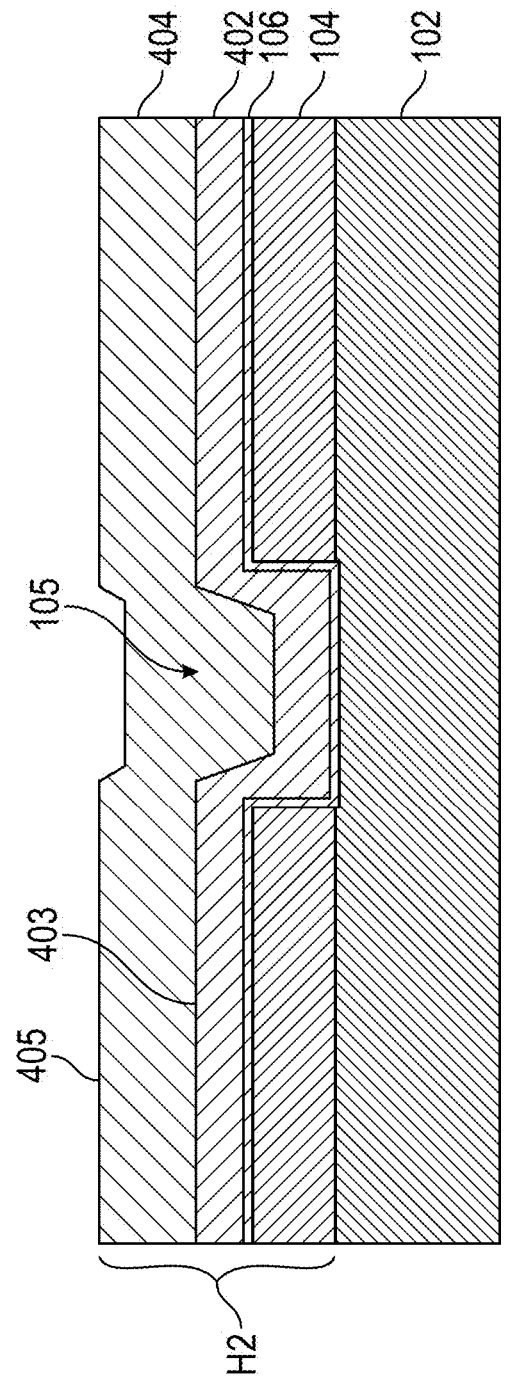

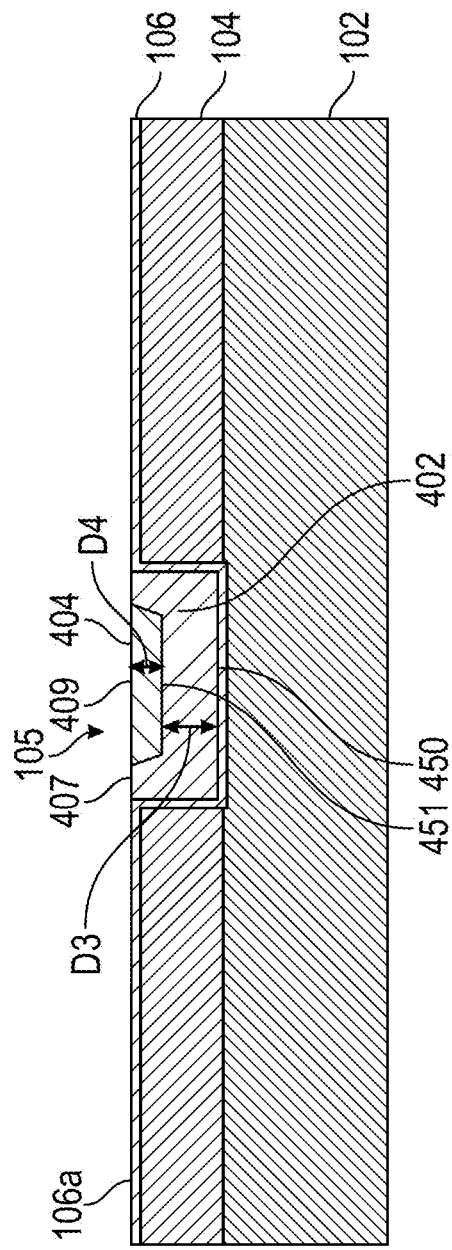
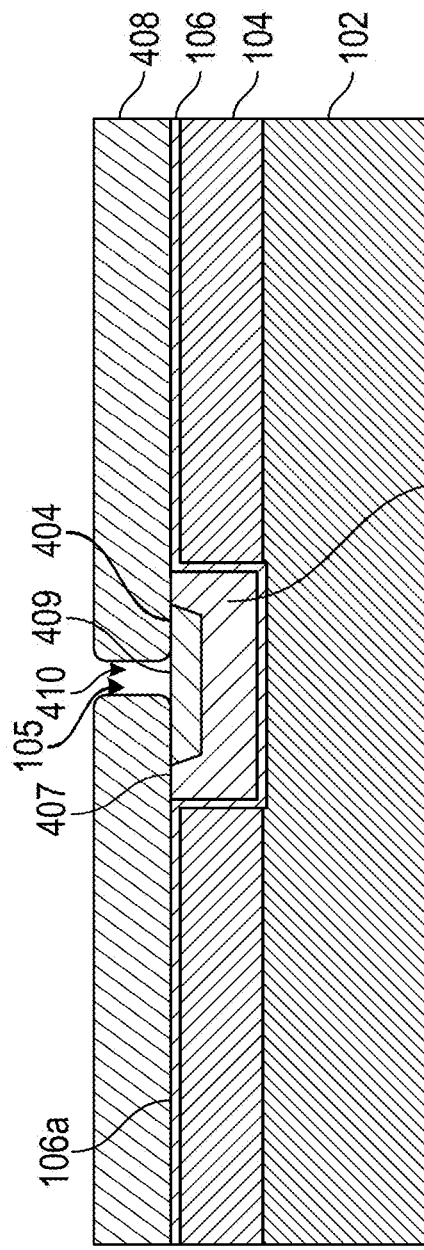

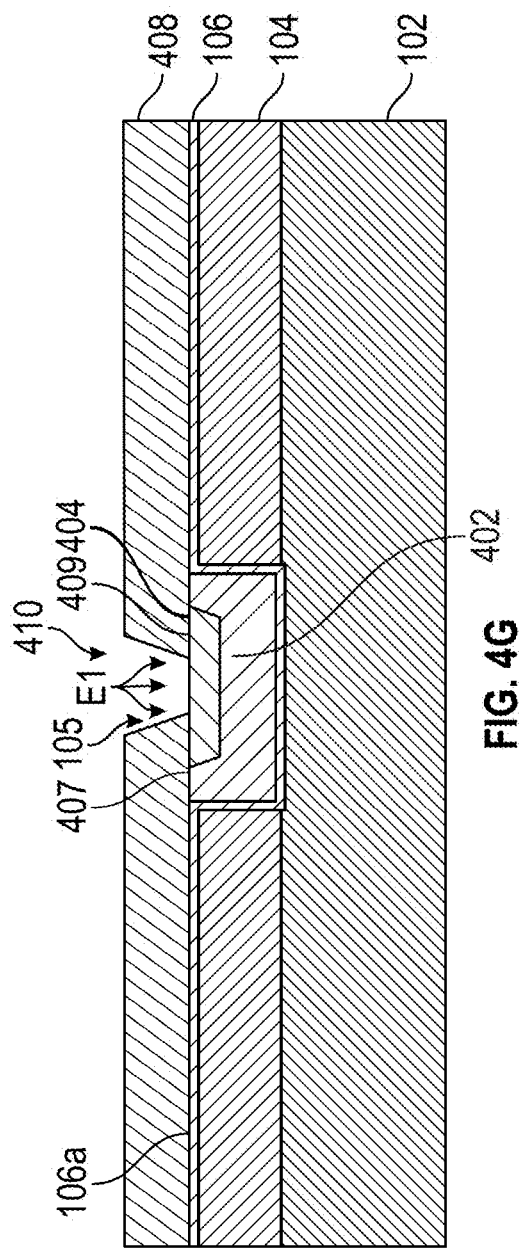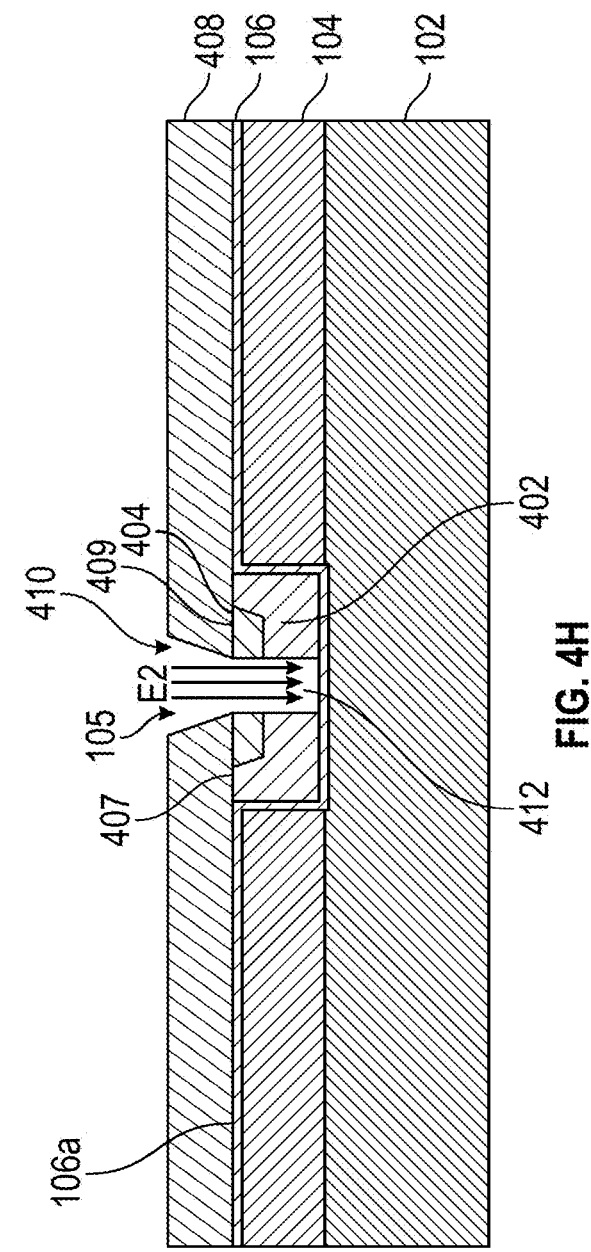

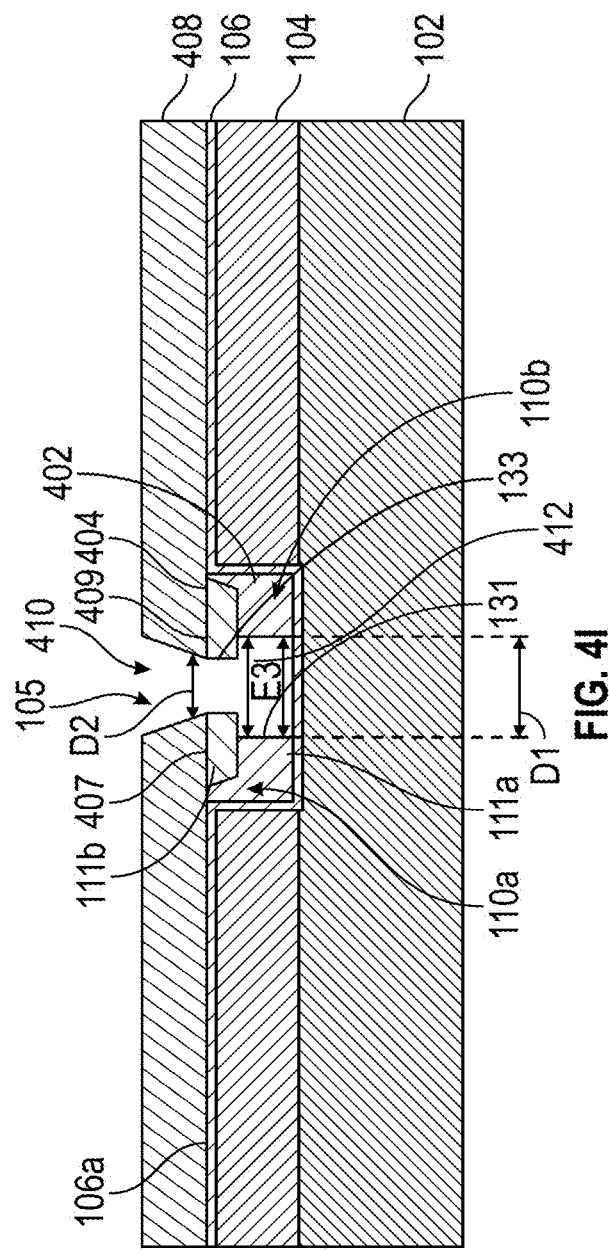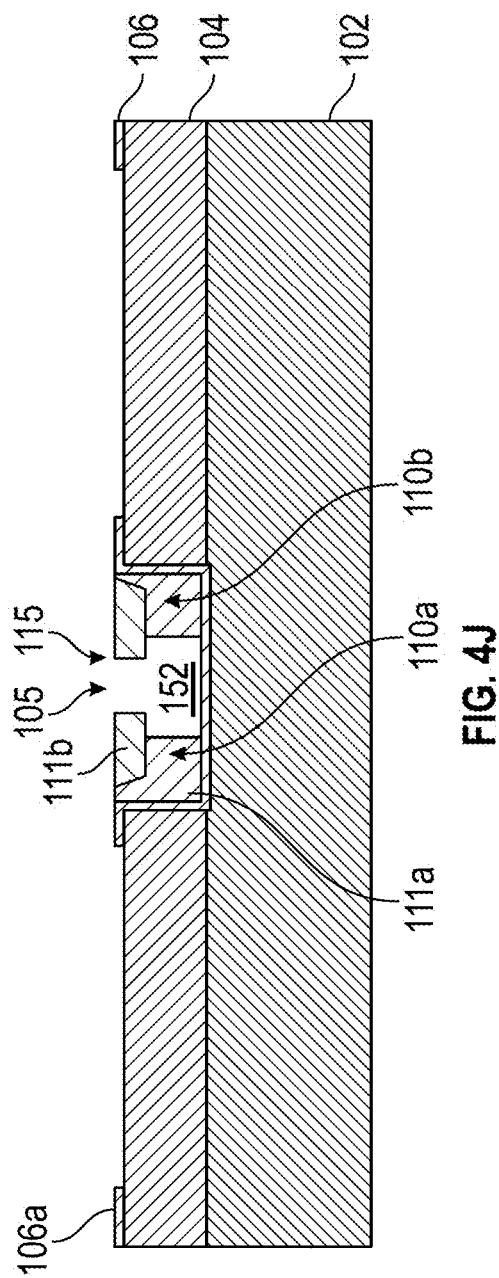
FIG. 4I
FIG. 4J

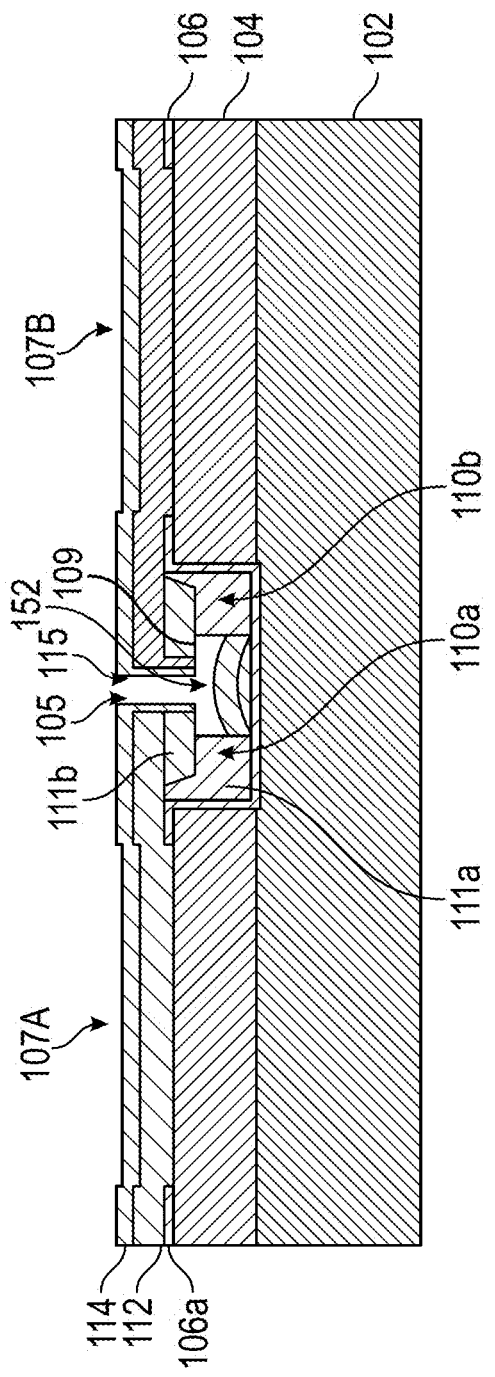
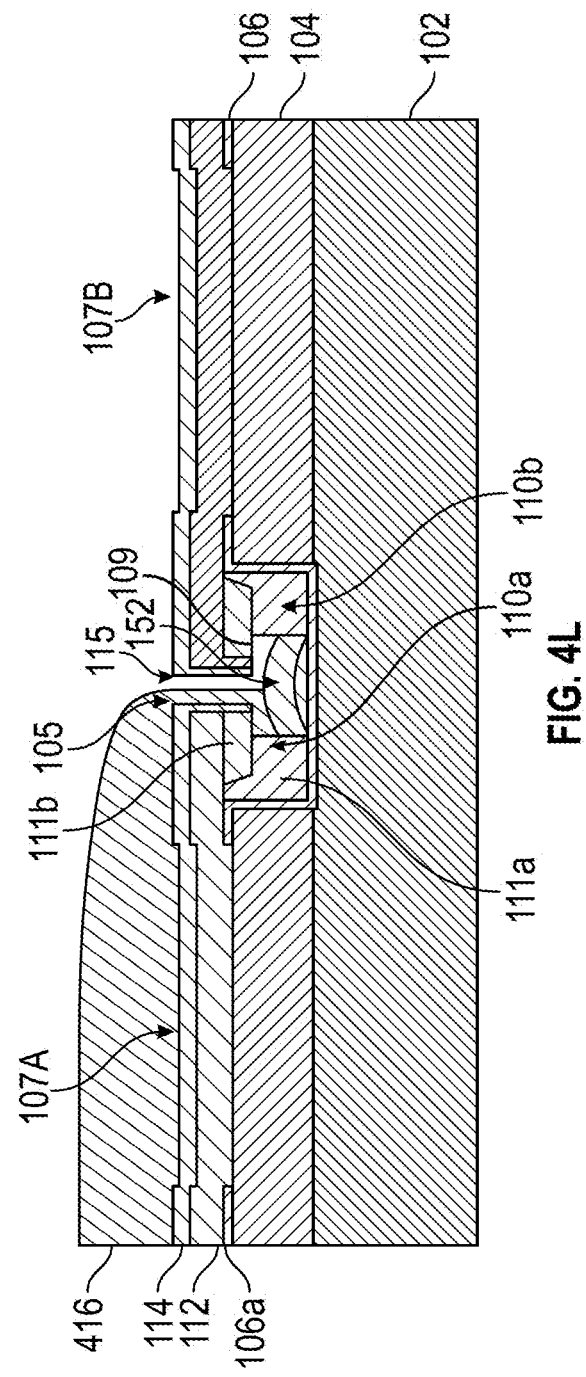

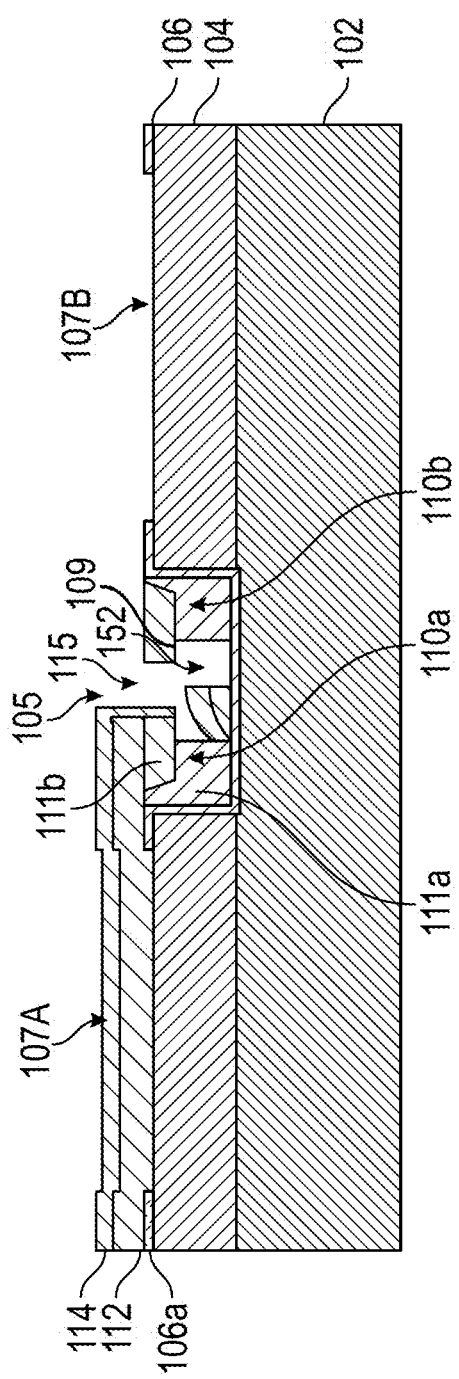
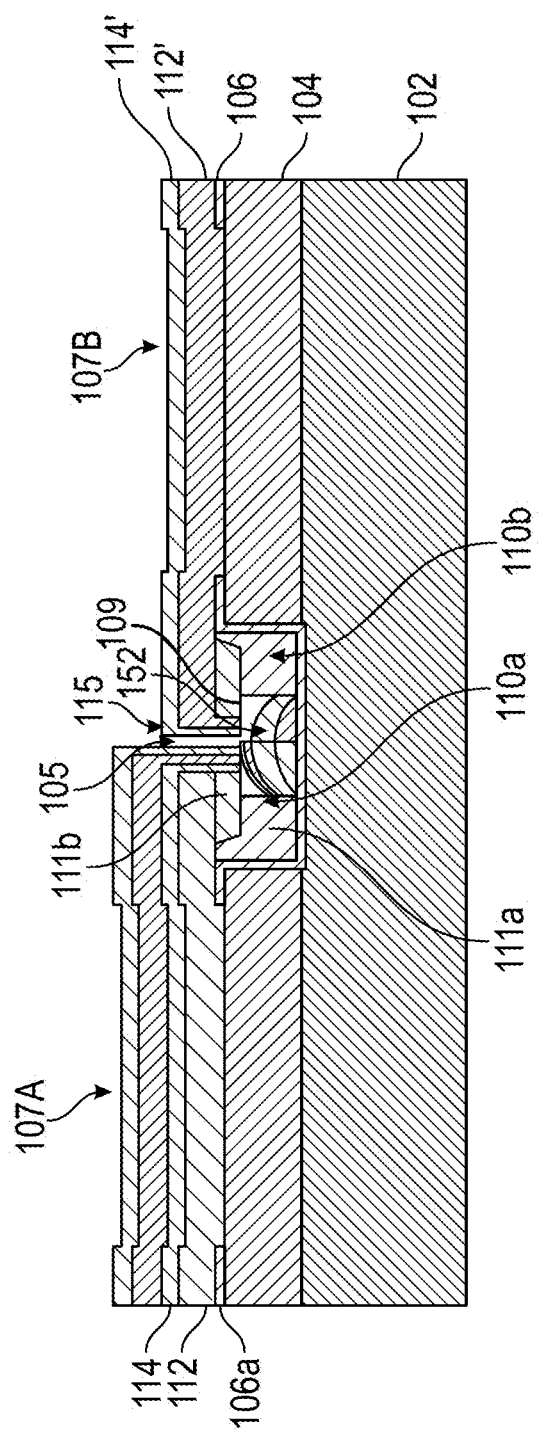
FIG. 4M
FIG. 4N

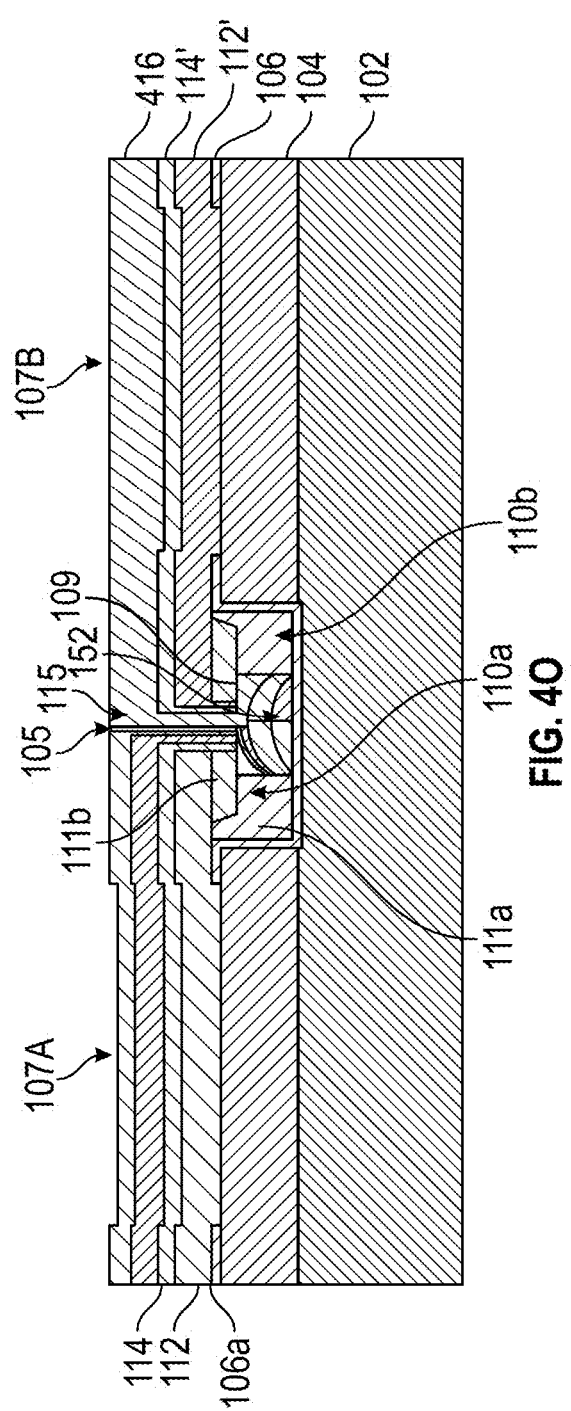
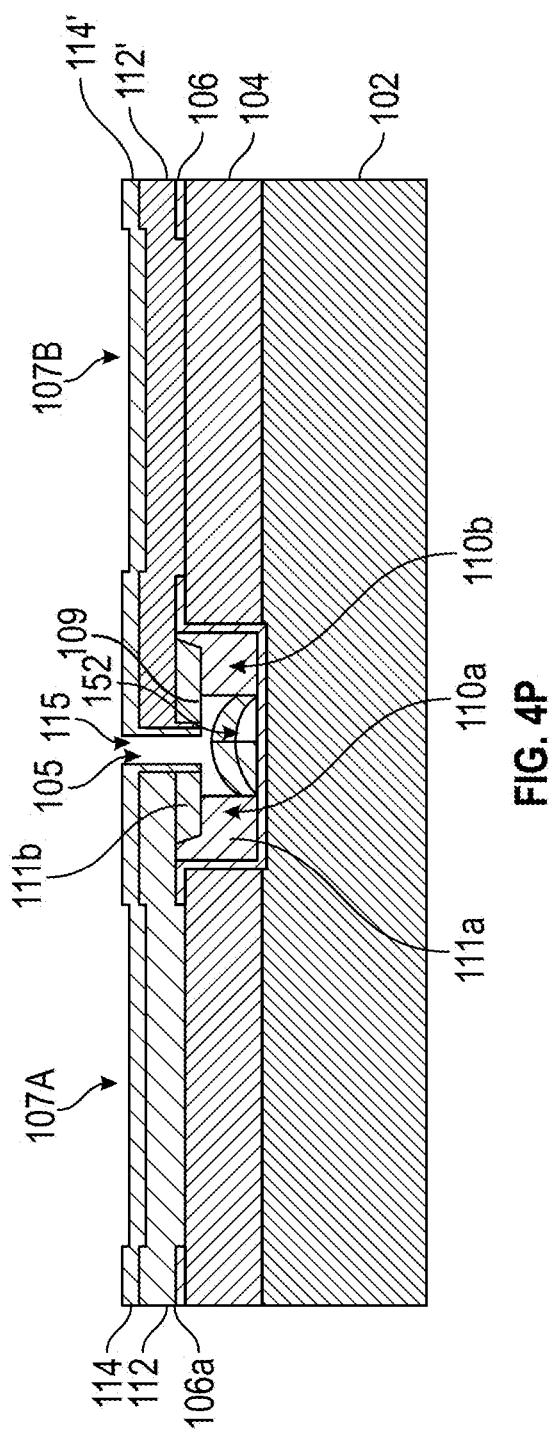

HIGH RESOLUTION ADVANCED OLED SUB-PIXEL CIRCUIT AND PATTERNING METHOD

CROSS-REFERENCE TO RELATED APPLICATIONS

This application claims priority to U.S. Provisional Patent Application Ser. No. 63/608,038, filed Dec. 8, 2023, and U.S. Provisional Patent Application Ser. No. 63/645,409, filed May 10, 2024 the contents of which are incorporated herein by reference.

BACKGROUND

Field

Embodiments described herein generally relate to a display. More specifically, embodiments described herein relate to sub-pixel circuits and methods of forming sub-pixel circuits that may be utilized in a display such as an organic light-emitting diode (OLED) display.

Description of the Related Art

Input devices including display devices may be used in a variety of electronic systems. An organic light-emitting diode (OLED) is a light-emitting diode (LED) in which the emissive electroluminescent layer is a film of an organic compound that emits light in response to an electric current. OLED devices are classified as bottom emission devices if light emitted passes through the transparent or semi-transparent bottom electrode and substrate on which the panel was manufactured. Top emission devices are classified based on whether or not the light emitted from the OLED device exits through the lid that is added following the fabrication of the device. OLEDs are used to create display devices in many electronics today. Today's electronics manufacturers are pushing these display devices to shrink in size while providing higher resolution, i.e., pixel-per-inch, than just a few years ago.

OLED pixel patterning is currently based on a process that restricts panel size, pixel resolution, and substrate size. Rather than utilizing a fine metal mask, photo lithography should be used to pattern pixels. Currently, OLED pixel patterning requires lifting off organic material after the patterning process. When lifted off, the organic material leaves behind a particle issue that disrupts OLED performance.

Accordingly, what is needed in the art are sub-pixel circuits and methods of forming sub-pixel circuits to increase pixel-per-inch and provide improved OLED performance.

SUMMARY

Embodiments described herein generally relate to a display. More specifically, embodiments described herein relate to sub-pixel circuits and methods of forming sub-pixel circuits that may be utilized in a display such as an organic light-emitting diode (OLED) display.

In one or more embodiments, a sub-pixel circuit includes at least two anodes disposed over a substrate. The anodes have an anode thickness from the substrate to an uppermost surface of the anode. Adjacent anodes define a well. Adjacent overhang structures are disposed in the well. The overhang structures have an overhang thickness from the substrate to an upper surface of the overhang structures. The upper surface and the uppermost surface are co-planar. The overhang thickness and the anode thickness are substantially equivalent. The overhang structures include overhang extensions extending past lower sidewalls. The well has a trench area defined by the lower sidewalls and a bottom surface of the overhang extensions, with a gap between the overhang extensions of the adjacent overhang structures. An organic light emitting diode (OLED) material is disposed over the anode, the upper surface of the overhang structures, under the overhang structures, and within the trench area. A cathode is disposed over the OLED material. An encapsulation layer disposed over the cathode.

In one or more embodiments, a device includes a plurality of sub-pixel lines. Each sub-pixel line includes at least a first sub-pixel and a second sub-pixel. The first sub-pixel and the second sub-pixel each include anodes disposed over a substrate. The first sub-pixel and the second sub-pixel each further include a plurality of overhang structures that are disposed over the substrate alongside opposite sidewalls of the anodes. The plurality of overhang structures include a first portion including a first material. The first portion further includes a lower sidewall. The plurality of overhang structures further include a second portion disposed over at least a portion of the first portion. The second portion includes a second material. The second portion further includes an overhang extension extending past the lower sidewall. The lower sidewall of the first portion and a bottom surface of the overhang extension of the second portion partially define a trench area. The first sub-pixel and the second sub-pixel each further include an organic light emitting diode (OLED) material which is disposed over the anode, an upper surface of the overhang structures under the overhang structures, and within the trench area. A cathode is disposed over the OLED material. An encapsulation layer is disposed over the cathode.

In one or more embodiments, a sub-pixel circuit includes a plurality of anodes disposed over a substrate. Adjacent anodes define a well. Adjacent overhang structures are disposed in the well. The adjacent overhang structures include a first portion. The first portion includes a lower sidewall. The adjacent overhang structures further include a second portion which is disposed over at least a portion of the first portion. The second portion includes an overhang extension which extends past the lower sidewall. The well has a trench area, defined by the lower sidewall of the first portion and a bottom surface of the overhang extension of the second portion, with a gap between the second portions of the adjacent overhang structures. The sub-pixel circuit further includes an organic light emitting diode (OLED) material which is disposed over the anode, an upper surface of the overhang structures, under the overhang structures, and within the trench area. A cathode is disposed over the OLED material that is disposed over the upper surface of the overhang structures, under the overhang structures, and within the trench area. An encapsulation layer is disposed over the cathode. The encapsulation layer extends under at least a portion of the second portion along the lower sidewall of the first portion, and contacts the bottom surface of the overhang extension of the overhang structures.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 1C is a schematic, cross-sectional view of a sub-pixel circuit having a line-type architecture according to embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1A:
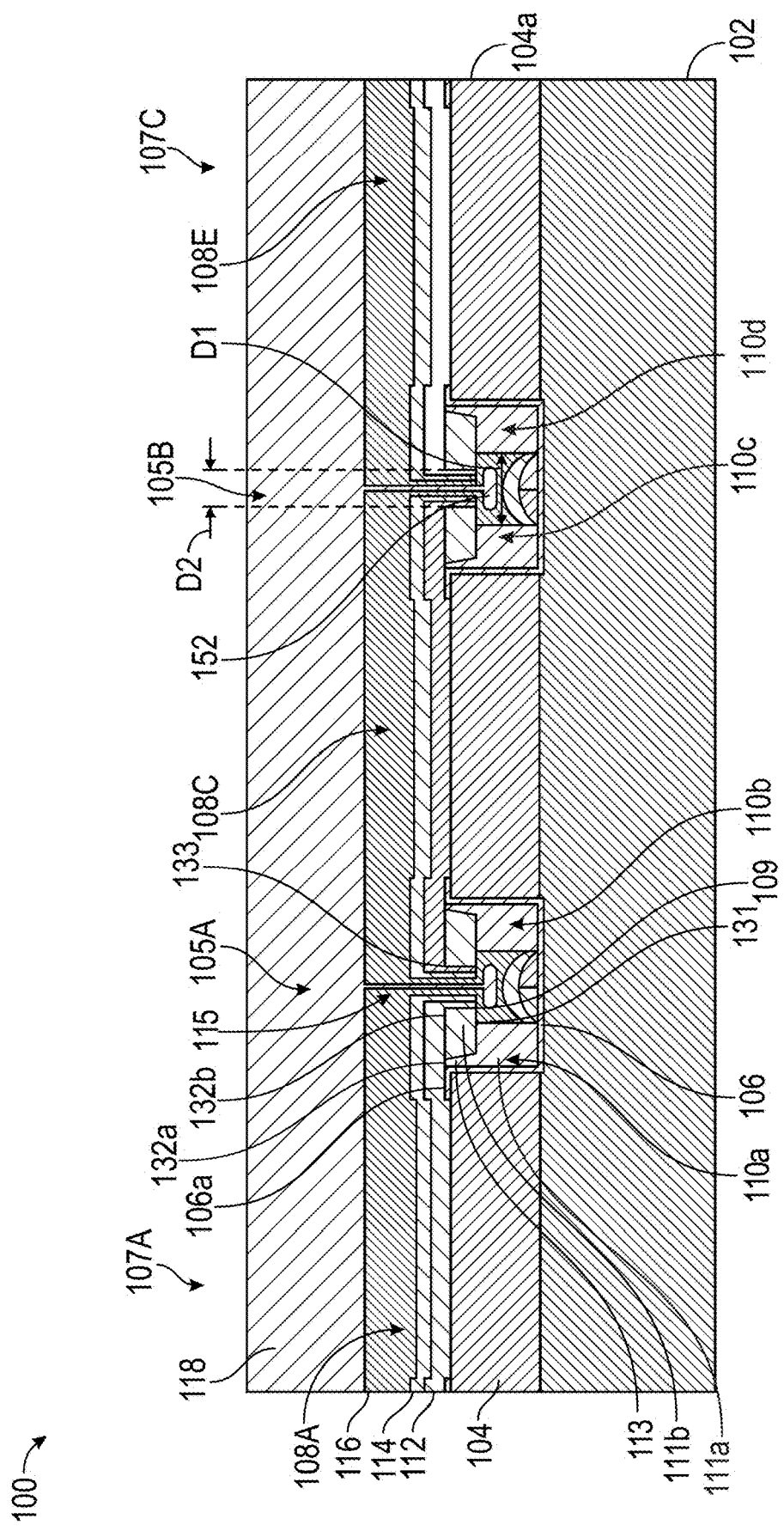
FIG. 1A is a schematic, cross-sectional view of a sub-pixel circuit at section line 1A-1A according to embodiments.

Embodiments described herein generally relate to a display. More specifically, embodiments described herein relate to sub-pixel circuits and methods of forming sub-pixel circuits that may be utilized in a display such as an organic light-emitting diode (OLED) display. In various embodiments, the sub-pixels employ advanced overhang structures to improve functionality of the display.

In one embodiment, a sub-pixel is provided. The sub-pixel includes an anode, overhang structures, separation structures, an organic light emitting diode (OLED) material, and a cathode. The anode is defined by a raised metal structure formed over a substrate. The overhang structures, in some embodiments, are disposed on a protective layer within a well in-between the anodes along a pixel plane. The overhang structures include a second overhang portion disposed over a first overhang portion. The second overhang portion may be disposed on the first overhang portion. I.e., the second overhang portion has an extension that extends past a lower sidewall of the first overhang portion. E.g., a bottom surface of the second portion extends laterally past the lower sidewall of the first portion. In embodiments with the protective layer, the first portion is disposed on the protective layer. The first portion has an upper sidewall and the lower sidewall. The lower sidewall extends past the upper sidewall. The upper sidewall contacts a sidewall of the second portion. The second portion and the first portion include different compositions.

In some embodiments, the different compositions of the second portion and the first portion results in different etch rates such that the second portion has an extension that extends past a lower sidewall of the first portion as described herein. The separation structures are disposed on a protective layer in-between the anodes along a line plane. The separation structures include a second layer disposed over a first layer. The first layer of the separation structure includes a trench formed in the upper surface. The trench includes a plurality of inner sidewalls. The second layer of the separation structure is disposed within the trench. The second layer of the separation structure contacts the plurality of inner sidewalls of the first layer. The second layer of the separation structure is formed of a material having the same composition as the second portion of the overhang structure. The first layer of the separation structure is formed of a material having the same composition as the first portion of the overhang structure. The first layer and the second layer of the separation structure include different compositions. In some embodiments, the different compositions of the second layer and the first layer results in different etch rates. The OLED material is disposed over the anode, an upper surface of the overhang structures, a sidewall of the overhang structures, within the well, and an upper surface of the separation structures. In embodiments with the protective layer, the OLED material is disposed over the protective layer within the well, and an upper portion of the protective layer disposed over the anode. The cathode disposed over the OLED material.

In another embodiment, a device is disclosed. The device includes a plurality of sub-pixel lines. Each sub-pixel line includes at least a first sub-pixel and a second sub-pixel. The first sub-pixel and the second sub-pixel each include an anode, overhang structures, separation structures, an organic light emitting diode (OLED) material, and a cathode. The anode is defined by a raised metal structure formed over a substrate. The overhang structures are disposed on a protective layer within a well in-between the anodes, along opposite sidewalls of the anodes along a pixel plane. The overhang structures include a second portion disposed over the first portion. The second overhang portion may be disposed on the first overhang portion. I.e., the second overhang portion has an extension that extends past a lower sidewall of the first overhang portion. E.g., a bottom surface of the second portion extends laterally past the lower sidewall of the first portion. In embodiments with the protective layer, the first portion is disposed on the protective layer. The first portion has an upper sidewall and the lower sidewall. The lower sidewall extends past the upper sidewall. The upper sidewall contacts a sidewall of the second portion. The second portion and the first portion include different compositions.

In some embodiments, the different compositions of the second portion and the first portion results is different etch rates such that the second portion has an extension that extends past a lower sidewall of the first portion as described herein. The separation structures are disposed on a protective layer in-between the anodes along a line plane. The separation structures are disposed on a protective layer in-between the anodes along a line plane. The separation structures include a second layer disposed over a first layer. The first layer of the separation structure includes a trench formed in the upper surface. The trench includes a plurality of inner sidewalls. The second layer of the separation structure is disposed within the trench. The second layer of the separation structure contacts the plurality of inner sidewalls of the first layer. The second layer of the separation structure is formed of a material having the same composition as the second portion of the overhang structure. The first layer of the separation structure is formed of a material having the same composition as the first portion of the overhang structure. The first layer and the second layer of the separation structure include different compositions. In some embodiments, the different compositions of the second layer and the first layer results in different etch rates. The OLED material is disposed over the anode, an upper surface of the overhang structures, a sidewall of the overhang structures, within the well, and an upper surface of the separation structures. In embodiments with the protective layer, the OLED material is disposed over the protective layer within the well, and an upper portion of the protective layer disposed over the anode. The OLED material of the first subpixel and the second subpixel emit a first color. The cathode is disposed over the OLED material.

Each of the embodiments described herein of the sub-pixel circuit include a plurality of sub-pixels with each of the sub-pixels are defined by adjacent overhang structures that are permanent to the sub-pixel circuit. While the Figures depict two sub-pixels or three sub-pixels with each sub-pixel defined by adjacent overhang structures, the sub-pixel circuit of the embodiments described herein include a plurality of sub-pixels, such as two or more subpixels. Each sub-pixel has OLED materials configured to emit a white, red, green, blue or other color light when energized. E.g., the OLED materials of a first sub-pixel emits a red light when energized, the OLED materials of a second sub-pixel emits a green light when energized, and the OLED materials of a third sub-pixel emits a blue light when energized.

The overhangs are permanent to the sub-pixel circuit and include at least a second portion disposed over a first portion. The overhang structures defining each sub-pixel of the sub-pixel circuit of the display provide for formation of the sub-pixel circuit using evaporation deposition and provide for the overhang structures to remain in place after the sub-pixel circuit is formed. Evaporation deposition is utilized for deposition of OLED materials (including a hole injection layer (HIL), a hole transport layer (HTL), an emissive layer (EML), and an electron transport layer (ETL)) and cathode. In some instances, an encapsulation layer may be disposed via evaporation deposition. The overhang structures and the evaporation angle set by the evaporation source define the deposition angles, i.e., the overhang structures provide for a shadowing effect during evaporation deposition with the evaporation angle set by the evaporation source. In order to deposit at a particular angle, the evaporation source is configured to emit the deposition material at a particular angle with regard to the overhang structure. The encapsulation layer of a respective subpixel is disposed over the cathode with the encapsulation layer extending under at least a portion of each of the adjacent overhang structures and along a sidewall of each of the adjacent overhang structures.

Figure 1B:
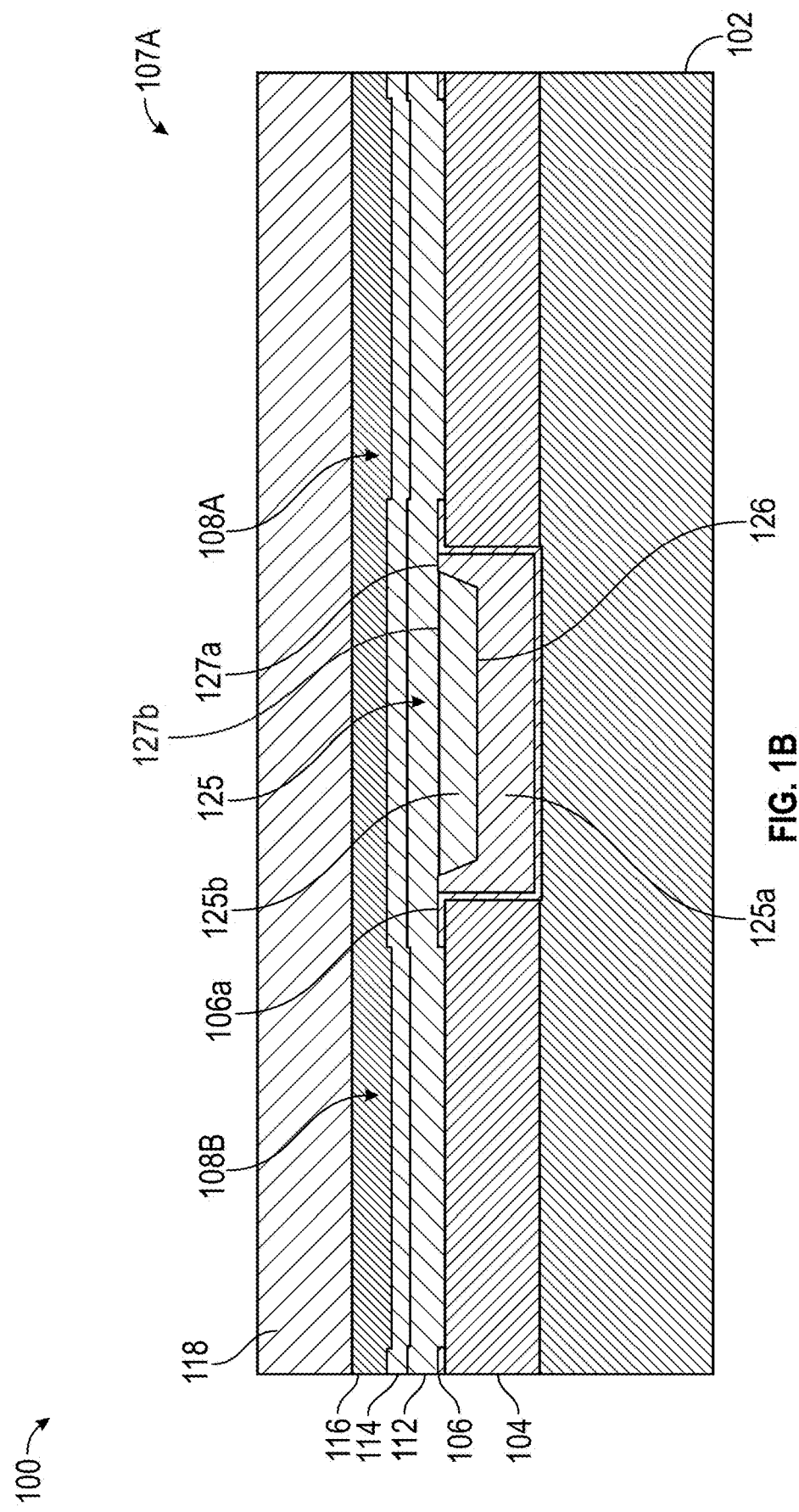
FIG. 1B is a schematic, cross-sectional view of a sub-pixel circuit at section line 1B-1B according to embodiments.
Figure 4A:
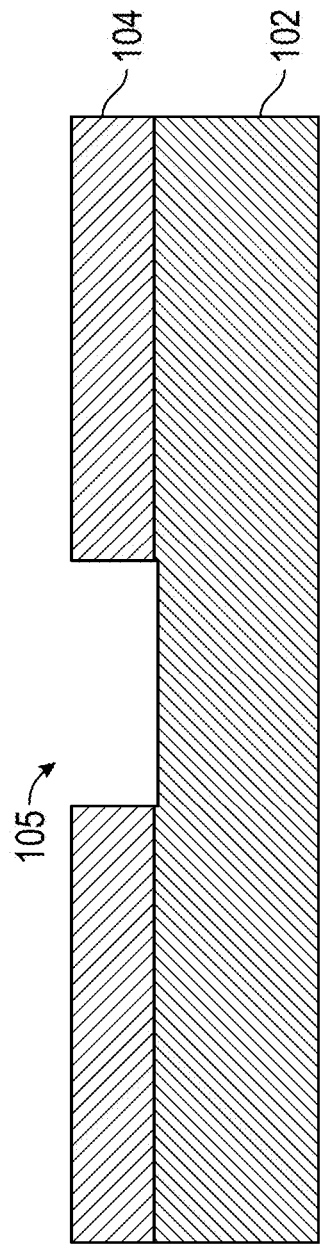
FIGS. 4A-4Q are schematic, cross-sectional views of a substrate during a method of forming a sub-pixel according to embodiments.

FIG. 1A is a schematic, cross-sectional view of a sub-pixel circuit 100, according to one or more embodiments. The cross-sectional view of FIG. 1A is taken along section line 1A-1A of FIG. 1C (e.g., a pixel plane). FIG. 1B is a schematic, cross-sectional view of a sub-pixel circuit 100 according to embodiments. The cross-sectional view of FIG. 1B is taken along section line 1B-1B of FIG. 1C (e.g., a line plane). The sub-pixel circuit 100 includes a substrate 102. The substrate 102 is a backplane. The backplane includes, but is not limited to, a complementary metal-oxide-semiconductor (CMOS) array or a thin-film transistor (TFT) array. Metal-containing structures (e.g., anodes 104) are patterned over the substrate 102. In some embodiments, each of the anodes 104 include a monolithic structure 104a disposed over an upper surface of the substrate 102. The material of the monolithic structure 104a of the anode 104 includes titanium (Ti). In other embodiments, the anode 104 includes of at least three anode layers, as shown in FIG. 4Q. The anodes 104 of the entire sub-pixel circuit 100 in a first embodiment include the three anode layers or the anodes 104 of the entire sub-pixel circuit 100 in a second embodiment include the monolithic structure 104a. A first anode layer 104b formed over the upper surface of the substrate 102. The first anode layer 104b includes of an aluminum copper alloy (AlCu) containing material. A second anode layer 104c is formed over the first anode layer 104b. The second anode layer 104c includes a titanium nitride (TiN) containing material. A third anode layer 104d includes the second anode layer 104c. The third anode layer 104d is formed of a transparent conductive oxide (TCO) material. It should be understood that for illustrative purposes most of the figures in the present disclosure represent the anode 104 as a monolithic structure including a single layer. However, the anode 104 can include any number of layers including but not limited to the embodiments described above. The total thickness, i.e, anode thickness H4, of the anode 104 is about 200 nm to about 400 nm, such as a total thickness of about 300 nm. It is contemplated that the anodes 104 may by formed either directly on the top surface of the substrate or over a top surface the base layer. The anodes 104 are configured to operate as anodes of respective sub-pixels.

A protective layer 106 may be disposed over the substrate 102 and/or at least a portion of the anodes 104. The protective layer 106 may be formed along both the pixel plane and the line plane. The protective layer 106 may be disposed over the substrate 102 in between the adjacent anodes 104 along both the pixel plane and the line plane. The protective layer 106 may extend from the upper surface of the substrate 102, along a sidewall of the anode 104, to the upper surface of the anode 104. An upper portion 106a of the protective layer 106 contacts at least a portion of the upper surface of the anode near the sidewalls of the anode 104. The upper portion 106a of the protective layer 106 extends along both the pixel plane and the line plane. The protective layer 106 is formed of a material including aluminum oxide ($Al_2O_3$). The protective layer is about 10 nm to about 50 nm, such as a thickness of about 20 nm.

The sub-pixel circuit 100 has a plurality of sub-pixel lines (e.g., first sub-pixel line 107A, second sub-pixel line 107B, and third sub-pixel line 107C). The sub-pixel lines are adjacent to each other along the pixel plane. Each sub-pixel line includes at least two sub-pixels. E.g., the first sub-pixel line 107A includes a first sub-pixel 108A and a second sub-pixel 108B, the second sub-pixel line 107B includes a third sub-pixel 108C and a fourth sub-pixel 108D, and the third sub-pixel line 107C includes a fifth sub-pixel 108E and a sixth sub-pixel 108F. The first sub-pixel 108A and the second sub-pixel 108B are aligned along the line plane. The first sub-pixel 108A, the third sub-pixel 108C, and the fifth sub-pixel 108E are aligned in the pixel plane. While FIG. 1A depicts the first sub-pixel line 107A, the second sub-pixel line 107B, and the third sub-pixel line 107C, the sub-pixel circuit 100 of the embodiments described herein may additional sub-pixel lines such as a fourth sub-pixel line. Each sub-pixel line has OLED materials configured to emit a white, red, green, blue or other color light when energized. E.g., the OLED materials of the first sub-pixel line 107A emits a red light when energized, the OLED materials of the second sub-pixel line 107B emits a green light when energized, the OLED materials of the third sub-pixel line 107C emits a blue light when energized, and the OLED materials of a fourth sub-pixel emits another color light when energized. The OLED materials within a sub-pixel line may be configured to emit the same color light when energized. E.g., the OLED materials of the first sub-pixel 108A and the second sub-pixel 108B of the first sub-pixel line 107A emit a red light when energized and the OLED materials of the third sub-pixel 108C and the fourth sub-pixel 108D of the second sub-pixel line 107B emit a green light when energized.

Adjacent sub-pixel lines are divided by an opening 115 of a well 105 that extends along the line plane in-between the anodes 104 of adjacent sub-pixel lines. For example, FIG. 1A illustrates sub-pixel circuit 100 including a first well 105A and a second well 105B. The first well 105A is defined by the anodes 104 of the first sub-pixel 108A and the second sub-pixel 108B of first sub-pixel line 107A, and the anodes 104 of the third sub-pixel 108C and the fourth sub-pixel 108D of the second sub-pixel line 107B. The opening 115 of the first well 105A divides the first sub-pixel line 107A and the second sub-pixel line 107B. The second well 105B is defined by the anodes 104 of the third sub-pixel 108C and the fourth sub-pixel 108D of second sub-pixel line 107B, and the anodes 104 of the fifth sub-pixel 108E and the sixth sub-pixel 108F of the third sub-pixel line 107C. The opening 115 of the second well 105B divides the second sub-pixel line 107B and the third sub-pixel line 107C.

Each sub-pixel line includes a two overhang structures 110 extending along the line plane, disposed within the wells 105, on along opposite sidewalls of the anodes 104 within a sub-pixel line. For example, the second sub-pixel line 107B includes a second overhang structure 110b and a third overhang structure 110c disposed alongside opposites sidewalls of the anodes 104 of the third sub-pixel 108C and the fourth sub-pixel 108D. Each well 105 includes a plurality of adjacent overhang structures 110 extending throughout the line plane along the portion of the sub-pixel line within the well. For example, the first well 105A includes a first overhang structure 110a and a second overhang structure 110b. The first overhang structure 110a extends though the line plane, along a portion the first sub-pixel line 107A within the first well 105A, and the second overhang structure 110b extends through the line plane along a portion of the second sub-pixel line 107B within the first well 105A. The second well 105B includes a third overhang structure 110c and a fourth overhang structure 110d. The third overhang structure 110c extends though the line plane, along a portion the second sub-pixel line 107B within the second well 105B, and the fourth overhang structure 110d extends through the line plane along a portion of the third sub-pixel line 107C within the second well 105B. An upper sidewall 133 of a second portion 111b of the adjacent overhang structures 110 within a well 105 define the opening 115 into the well 105.

Each overhang structure 110 includes a first portion 111a, and a second portion 111b. The first portion 111a may be disposed on the protective layer 106 along the sidewalls of the anodes 104 of the respective sub-pixel line. The first portion 111a includes a first material having a first composition. The first composition includes silicon (Si), silicon nitride ($Si_3N_4$), silicon oxide ($SiO_2$), or combinations thereof. The first portion includes a lower sidewall 131. The second portion 111b is disposed over an upper surface of the first portion 111a. The second portion 111b includes a second material having a second composition. The first composition and the second composition are different from one another. The second composition includes silicon (Si), silicon nitride ($Si_3N_4$), silicon oxide ($SiO_2$), or combinations thereof. The first composition and the second composition have different etch rates when exposed to etch chemistries. A part of the second portion 111b extends past the lower sidewall 131 of the first portion 111a to form the overhang extension 109. The overhang extension 109 of the second portion 111b allows for the second portion 111b to shadow the first portion 111a. The first portion 111a includes a protrusion 113. The protrusion 113 extends between the protective layer 106 and the second portion 111b. An upper surface 132a of the protrusion 113 is coplanar to an upper surface 132b of the second portion 111b. The upper surface 132a of the protrusion 113 and the upper surface 132b of the second portion 111b are both coplanar to an upper surface of the upper portion 106a of the protective layer 106. The lower sidewalls 131 and the overhang extensions 109 of the adjacent overhang structures 110 within the well at least partially define a trench area 152. The lower sidewalls 131 of the adjacent overhang structures 110 within a well 105 are separated by a distance D1. The upper sidewalls 133 of the adjacent overhang structures 110 within a well 105 are separated by a distance D2.

Each sub-pixel line includes an OLED material 112 and a cathode 114 disposed over the anode 104 and the overhang structures 110. The OLED material 112 may include one or more of a HIL, a HTL, an EML, and an ETL. The OLED material 112 is disposed over and in contact with the upper surface of the anodes 104 within a sub-pixel line. Additionally, the OLED material 112 is disposed over the upper portion 106a of the protective layer 106. Furthermore, OLED material 112 is disposed over the upper surface 132a of the protrusion 113, as well as the upper surface 132b of the second portion 111b. The OLED material 112 is disposed within at least a portion the trench area 152 not shadowed by the overhang extensions 109. Additionally, a thin layer of the OLED material 112 may be disposed over the upper sidewall 133 of the second portion 111b. The thin layer of the OLED material 112 may also be disposed within a portion of the trench area 152 shadowed by the overhang extensions 109. In one embodiment, the OLED material 112 is different from the first composition of the first portion 111a and the second composition of the second portion 111b. The cathode 114 is disposed over the OLED material 112. The thickness of the OLED material 112 and the cathode 114 are described in greater detail in FIG. 2.

The cathode 114 includes a conductive material, such as a metal. E.g., the cathode 114 includes, but is not limited to, silver, magnesium, chromium, titanium, aluminum, ITO, or a combination thereof. In one or more embodiments, material of the cathode 114 is different from the material of the first portion 111a. In one or more embodiments, the material of the cathode is different from the material of the second portion 111b.

The sub-pixel circuit 100 includes an encapsulation layer 116. The encapsulation layer 116 may be or may correspond to a local passivation layer. The encapsulation layer 116 of a respective sub-pixel is disposed over the cathode 114 (and OLED material 112) within the trench area 152, with the encapsulation layer 116 extending under at least a portion of each of the overhang extensions 109 and along the lower sidewall 131 of each of the overhang structures 110. The encapsulation layer 116 is disposed over the cathode 114 and over at least the lower sidewall 131. In some embodiments, which can be combined with other embodiments described herein, the encapsulation layer 116 is disposed over the upper sidewall 133. In some embodiments, which can be combined with other embodiments described herein, the encapsulation layer 116 is disposed over the upper surface 132a of the protrusion and the upper surface 132b of the second portion 111b. The encapsulation layer 116 includes the non-conductive inorganic material, such as the silicon-containing material. The silicon-containing material may include $Si_3N_4$ containing materials.

In one or more embodiments, as shown in FIGS. 1A and 1B, the encapsulation layer 116 extends over the cathode 114 disposed over the anode 104, and an upper surfaces 132a, 132b of the overhang structures 110. The encapsulation layer 116 extends into the trench area 152 and contacts a bottom surface of the overhang extension 109, as well as the lower sidewall 131. Additionally, the encapsulation layer is disposed over the OLED material 112 and the cathode 114 within the trench area 152. The encapsulation layer 116 includes the non-conductive inorganic material, such as the silicon-containing material. The silicon-containing material may include $Si_3N_4$ containing materials. In one or more embodiments, a global encapsulation layer 118 is over the encapsulation layer 116. The global encapsulation layer 118 layer fills the trench area 152 and the opening 115 and covers the entirety of the sub-pixel circuit 100.

Each sub-pixel line includes one or more separation structures 125, with adjacent sub-pixels sharing a separation structure 125 in the line plane. The separation structures 125 are permanent to the sub-pixel circuit 100. The separation structures 125 further define each sub-pixel of the sub-pixel line. The separation structures 125 are disposed over the protection layer 106 in-between the anodes 104 of the sub-pixels within a sub-pixel line. For example, FIG. 1B shows the first sub-pixel 108A and the second sub pixel 108B of the first sub-pixel line 107A. The separation structure 125 is disposed between the anodes 104 of the first sub-pixel 108A and the second sub-pixel 108B. The separation structure 125 includes a first layer 125a and a second layer 125b. The first layer 125a is disposed between the first sub-pixel 108A and the second sub-pixel 108B. The first layer 125a includes the first material having the first composition of the first portion 111a of the overhang structure 110. The first composition includes silicon (Si), silicon nitride ($Si_3N_4$), silicon oxide ($SiO_2$), or combinations thereof. The first layer 125a includes a channel 126 formed within an upper surface 127a of the first layer 125a. The second layer 125b is disposed within the channel 126 of the first layer 125a. The second layer 125b includes the second material having the second composition of the second portion 111b of the overhang structure 110. The second composition includes silicon (Si), silicon nitride ($Si_3N_4$), silicon oxide ($SiO_2$), or combinations thereof. An upper surface 127b of the second layer 125b is co-planer to the upper surface 127a of the first layer 125a. The upper surface 127a of the first layer 125a and the upper surface 127b of the second layer 125b are coplanar to the upper surface of upper portion 106a of the protective layer 106. The separation structure 125 extends along the pixel plane through the sub-pixel lines.

The OLED material 112 is disposed over and in contact with the anode 104 and the separation structure 125 in the line plane. The cathode 114 is disposed over the OLED material 112 in the line plane. The thickness of the OLED material 112 and the cathode 114 is substantially uniform in the line plane. The encapsulation layer 116 is disposed over the cathode 114 in the line plane. As shown in FIG. 1B, the OLED material 112, the cathode 114, and the encapsulation layer 116 maintain continuity along the length of the line plane in order to apply current across each sub-pixel line. In one or more embodiments, the global encapsulation layer 118 is disposed over the encapsulation layer 116 in the line plane.

FIG. 1C is a schematic, top view of a sub-pixel circuit 100, according to embodiments. It should be understood that FIG. 1C does not include the protective layer 106, OLED material 112, the cathode 114, the encapsulation layer 116, or the global encapsulation layer 118 for illustrative purposes. One or more busbars 150 are disposed adjacent to the substrate 102. The busbars 150 provide a current to the sub-pixel circuit 100. Although FIG. 1C depicts sub-pixel circuit 100 including four busbars 150, it is contemplated that any number of busbars can be used, including but not limited to one busbar, two busbars, three busbars, or six busbars.

Figure 2:
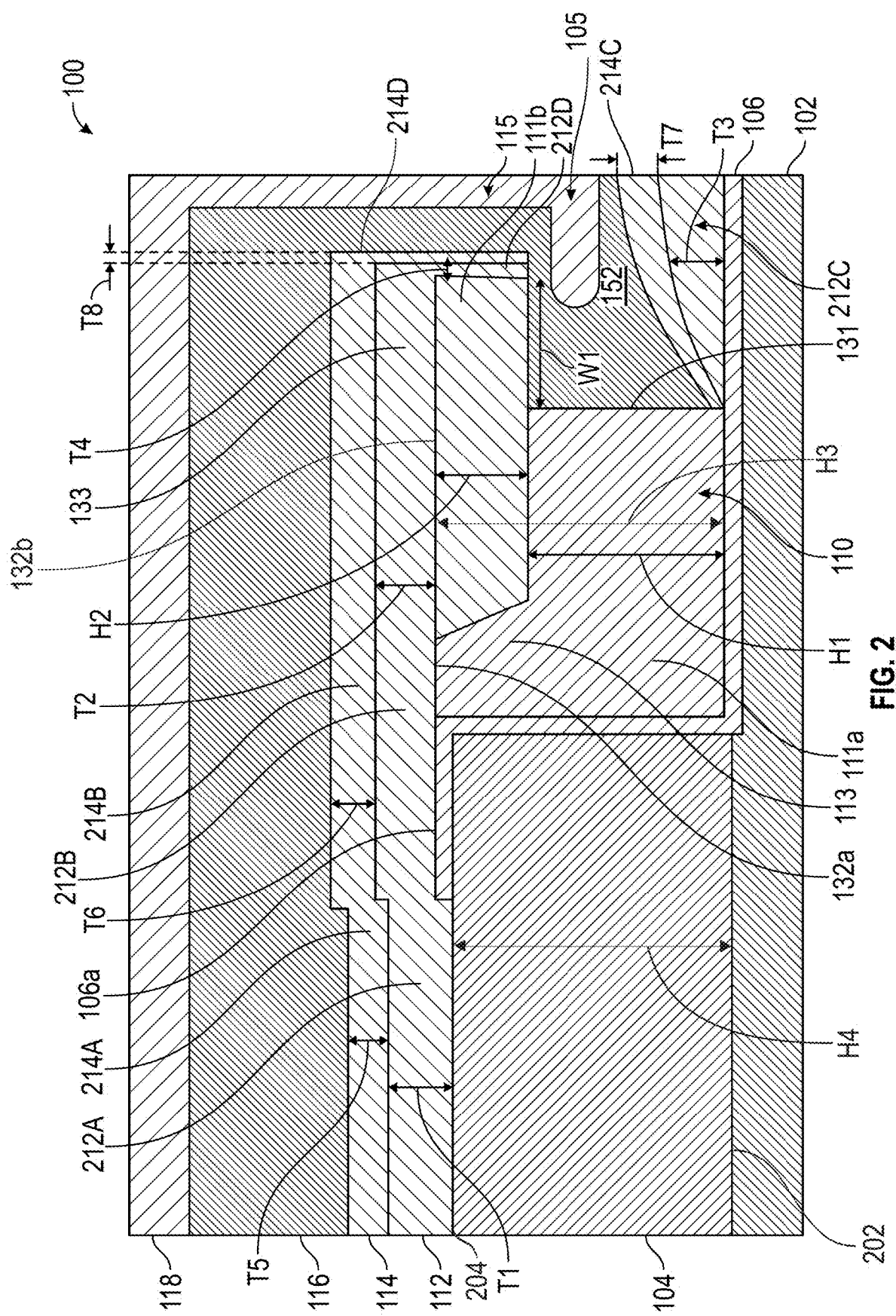
FIG. 2 is a schematic, cross-sectional view of an overhang structure according to embodiments.

FIG. 2 is a close up schematic, cross-sectional view of sub-pixel circuit 100, according to one or more embodiments. A first width W1 of the lower surface of the overhang extension 109 is defined by a distance from the lower sidewall 131 of the first portion 111a of the overhang structure 110 to the upper sidewall 133 of the second portion 111b of the overhang extension 110. A first height H1 is defined by the distance from a lower surface of the first portion 111a of the overhang structure 110 to the lower surface of the second portion 111b of the overhang structure 110. A second height H2 is defined by the distance from a lower surface of the second portion 111b of the overhang structure 110 to the upper surface of the second portion 111b of the overhang structure 110. An overhang thickness H3 is defined by the total combined distance of the first height H1 and the second height H2. The anode thickness H4 is defined by the total thickness of the anode 104 from a lower surface 202 of the anode 104 to the uppermost surface 204 of the anode 104. The anode thickness H4 is substantially the same as the overhang thickness H3 of the overhang structure. The trench area 152 has a trench width W2 between the lower sidewalls 131 of adjacent the first portions 111a.

The OLED material 112 is disposed over the anode 104, the overhang structure 110, and inside the trench area 152. The OLED material 112 has four different portions. The first portion 212A of the OLED material 112 is disposed over the upper surface of the anode 104. The first portion 212A is in direct contact with the anode 104. The first portion 212A has a first thickness T1. The first thickness T1 is the same across the entire first portion 212A. The second portion 212B of the OLED material 112 is disposed over the upper surface 132a of the protrusion 113 and the upper surface 132b of the second portion 111b. The upper surface 132a of the protrusion 113 and the upper surface 132b of the second portion 111b are all coplanar. The second portion 212B has a second thickness T2. The second thickness T1 is the same across the entire second portion 212B. The first thickness T1 and the second thickness T2 are substantially the same. An upper surface of the second portion 212B is offset from the upper surface of the first portion 212A by a distance substantially equivalent to the thickness of the protective layer 106. A third portion 212C of the OLED material 112 is disposed over the substrate 102 or the protective layer 106 within the well 105. The third portion 212C within the well 105 has a varying third thickness T3. The third portion 212C is thickest directly under the opening 115 of the trench area 152. The third thickness T3 under the overhang extension 109 is less than the third thickness T3 under the opening 115 of the trench area 152. The third thickness T3 decreases as the third portion 212C approaches the lower sidewalls 131 of the first portion 111a. The third thickness T3 under the opening 115 of the trench area 152 is substantially the same as the first thickness T1 and second thickness T2. The third thickness T3 under the overhang extension 109 is less than first thickness T1 and the second thickness T2. In some embodiments, as shown in FIG. 2, the third portion 212C contacts the sidewall of the first portion 111a of the overhang structure 110. In other embodiments, not shown, the third portion 212C may not extend to the sidewall of the first portion 111a of the overhang structure 110. The fourth portion 212D of the OLED material 112 is disposed over the upper sidewall 133 of the second portion 111b of the overhang structure 110. The fourth portion 212D has a fourth thickness T4. The fourth thickness T4 is less than the first thickness T1 and the second thickness T2. In some embodiments, a thin layer of OLED material 112 is disposed over the lower sidewall 131 of the first portion 111a of the overhang structure 110. In some embodiments, a thin layer of OLED material 112 is disposed over the lower surface of the overhang extension 109.

The cathode 114 is disposed over the OLED material 112. The cathode 114 has four different portions. The first portion 214A of the cathode 114 is disposed over the first portion 212A of the OLED material 112. The first portion 214A has a fifth thickness T5. The fifth thickness T5 is the same across the entire first portion 212A. The second portion 214B of the cathode 114 is disposed over second portion 212B of the OLED material 112. The second portion 212B has a sixth thickness T6. The sixth thickness T6 is the same across the entire second portion 212B The fifth thickness T5 and the sixth thickness T6 are substantially the same. An upper surface of the second portion 214B is offset from the upper surface of the first portion 214A by a distance substantially equivalent to the thickness of the protective layer 106. A third portion 214C of the cathode 114 is disposed over the third portion 212C of the OLED material 112 within the trench area 152. The third portion 214C within the well 105 has a seventh thickness T7. The seventh thickness T7 under the opening 115 of the trench area 152 is substantially the same as the fifth thickness T5 and sixth thickness T6. The seventh thickness T7 under the overhang extension 109 is less than fifth thickness T5 and the sixth thickness T6. In some embodiments, as shown in FIG. 2, the third portion 214C contacts the sidewall of the first portion 111a of the overhang structure 110. In other embodiments, not shown, the third portion 214C may not extend to the sidewall of the first portion 111a of the overhang structure 110. The fourth portion 214D of the cathode 114 is disposed over the fourth portion 212D of the OLED material 112. The fourth portion 214D has an eighth thickness T8. The eighth thickness T8 is less than the fifth thickness T5 and the sixth thickness T6. In some embodiments, a thin layer of cathode 114 is disposed over the lower sidewall 131 of the first portion 111a of the overhang structure. In some embodiments, a thin layer of the cathode 114 is disposed over the lower surface of the overhang extension 109.

Figure 3:
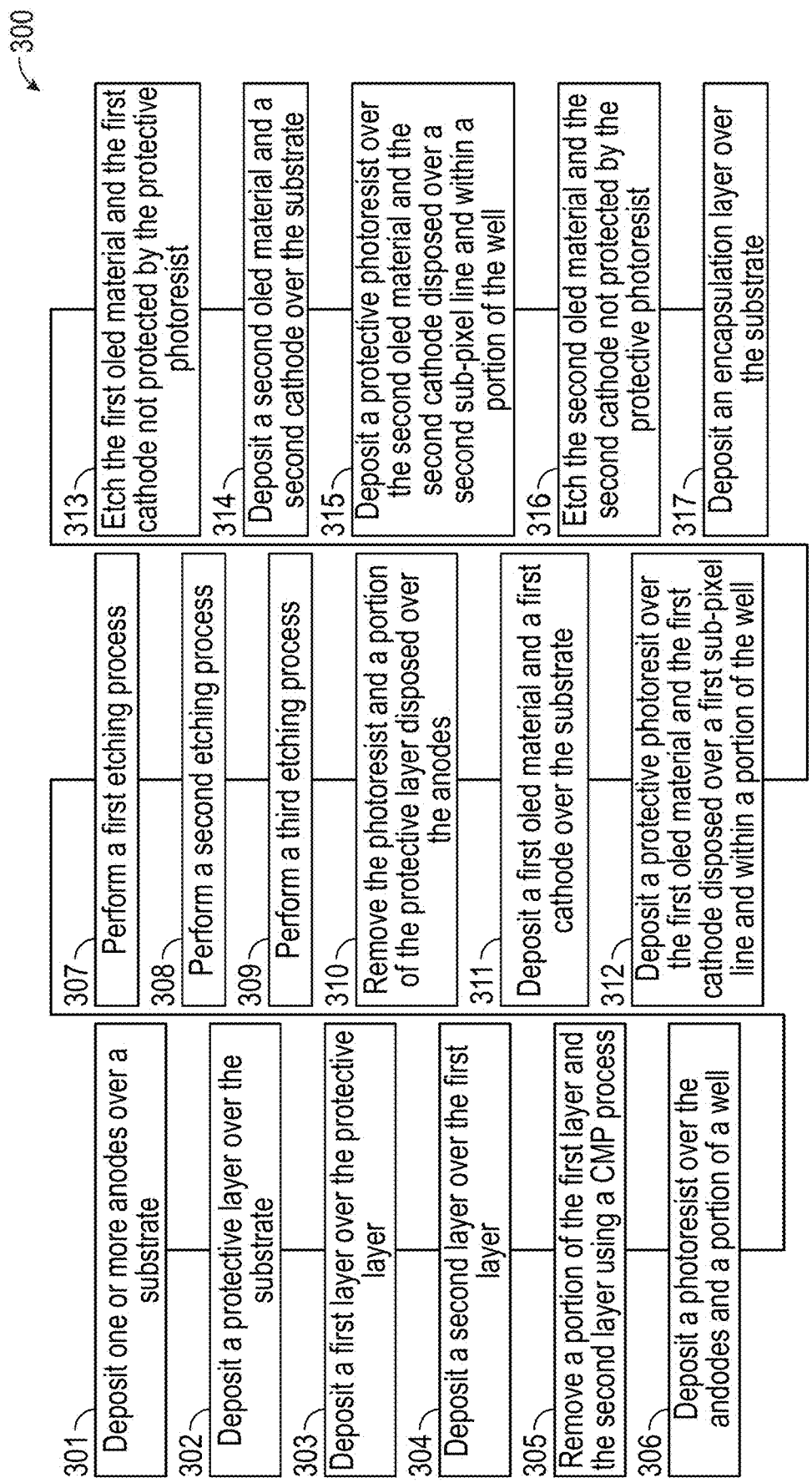
FIG. 3 is a flow diagram of a method for forming a sub-pixel according to according to embodiments.

FIG. 3 is a flow diagram of a method 300 for forming a sub-pixel circuit 100 according to embodiment. FIG. 4A-4Q are schematic, cross-sectional views of a substrate 102 during a method 300 for forming a sub-pixel circuit 100 according to embodiments described herein. It should be understood that although FIGS. 4A-4Q depict a substrate with two anodes, method 300 can be performed on a substrate with any number of anodes.

At operation 301, as shown in FIG. 4A (along the pixel plane), one or more anodes 104 are deposited over the substrate 102. The anode 104 may be deposited on the substrate 102. In another embodiment, the anode 104 is deposited on a base layer. The base layer is disposed on the substrate 102. The anode 104 may be deposited using metal-organic decomposition (MOD). A well 105 separates an anode 104 from an adjacent anode 104.

Figure 4B:
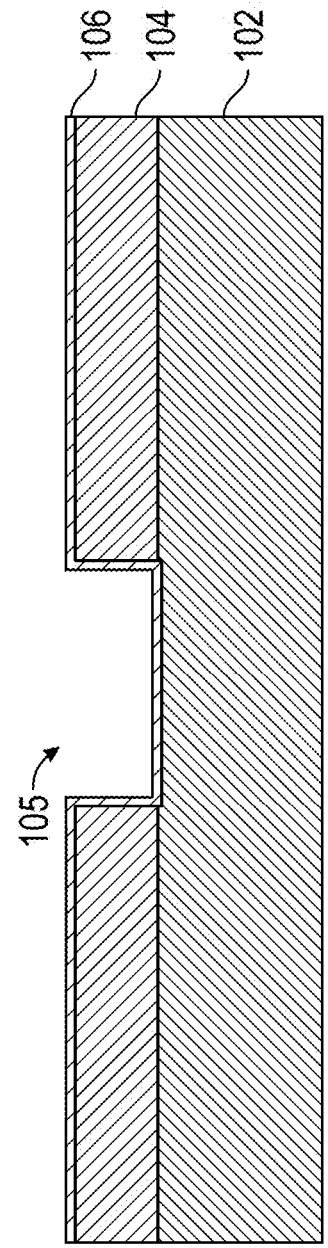
Figure 4Q:
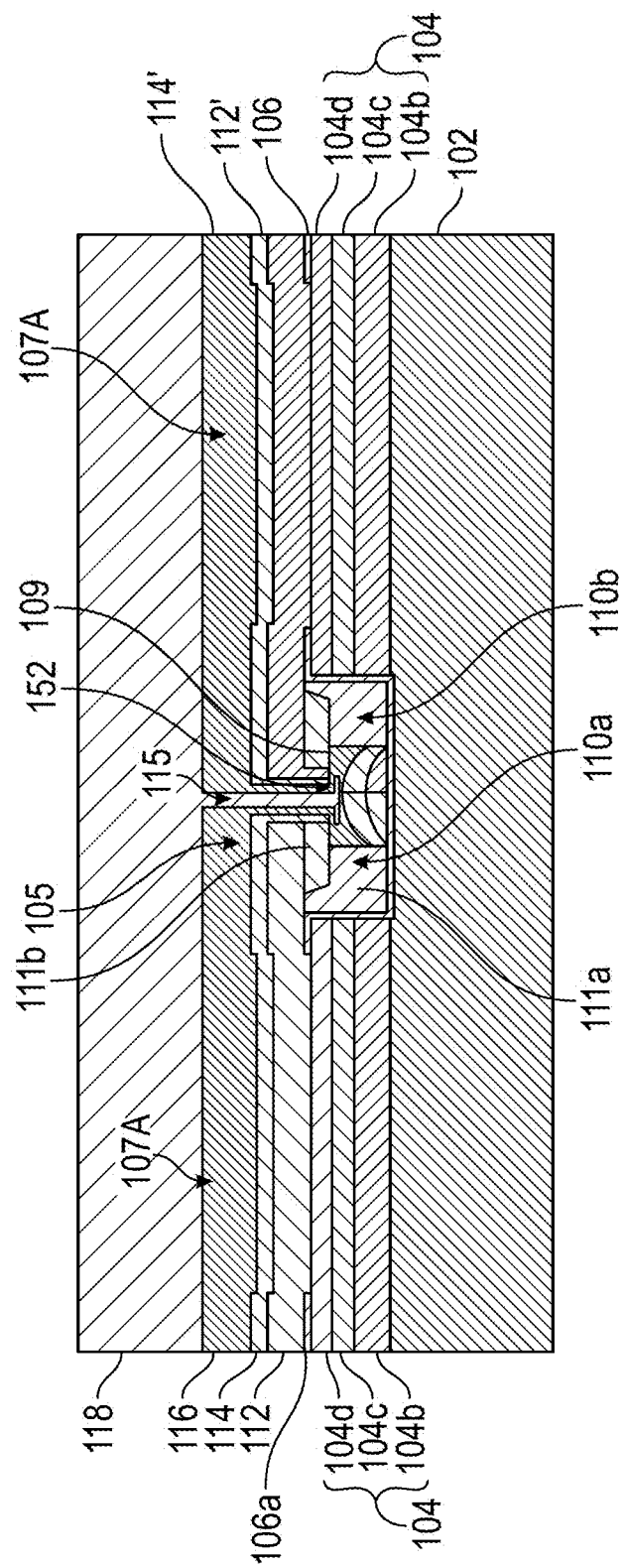

At operation 302, as shown in FIG. 4B (along the pixel plane), a protective layer 106 is deposited over the substrate 102. The protective layer 106 is deposited on both a top surface and the sidewalls of the anode 104. The protective layer 106 is also deposited between the anodes 104 within the well 105. The protective layer 106 is formed of a material including aluminum oxide ($Al_2O_3$). The protective layer 106 has a thickness within a range of about 10 nm to about 50 nm such as a thickness of about 20 nm.

At operation 303, as shown in FIG. 4C (along the pixel plane), a first material 402 is deposited over the protective layer 106. The first material 402 is deposited over the anodes 104 and within the well 105. A height H1 from the substrate 102 to an upper surface 403 of the first material 402 is within a range of about 400 nm to about 600 nm such as about 500 nm. The first material 402 has the first composition of the first portion 111a of the overhang structure 110 and the first layer 125a of the separation structure 125. The first composition includes silicon (Si), silicon nitride ($Si_3N_4$), silicon oxide ($SiO_2$), or combinations thereof.

At operation 304, as shown in FIG. 4D (along the pixel plane), a second material 404 is deposited over the first material 402. The second material 404 is deposited over the anodes 104 and within the well 105. A height H2 from the substrate 102 to an upper surface 405 of the second material 404 is within a range of about 700 nm to about 1000 nm such as about 800 nm. The second material 404 includes the second material having the second composition of the second portion 111b of the overhang structure and the second layer 125b of the separation structure. The difference in the first composition and the second composition results in different etch rates such that the second portion 111b has the overhang extension 109 that extends past a lower sidewall 131 of the first portion 111a as described herein. The different etch rates. The second composition includes silicon oxide ($SiO_2$). In one or more embodiments, one or more gaps may be formed while depositing the second material 404. A sputtering process may be performed in order to fill the gaps within the second material 404 with additional material.

At operation 305, as shown in FIG. 4E (along the pixel plane), portions of the first material 402 and the second material 404 are removed during a chemical mechanical planarization (CMP) process is performed on the first material 402 and the second material 404. The CMP process removes the portions of the first material 402 and the second material 404 disposed over the upper surface of the anodes 104. An upper surface 106a of the protection layer 106 disposed on the upper surface of the anodes 104 is exposed. A portion of the first material 402 and the second material 404 disposed within the well 105 is planarized so that a top surface 407 of the first material 402 and a top surface 409 of the second material 404 are coplanar. The upper surface 106a of the protective layer 106 disposed over the upper surface of the anode 104, the top surface 407 of the first material 402, and the top surface 409 or the second material 404 are all coplanar. A first distance D3 is defined by the distance between the lower surface 450 of the first material 402 and a channel surface 451 of the first material 402. Distance D3 is equivalent to first height H1 of the lower portion 111a of the overhang structure 110. A second distance D4 is defined by the distance between the channel surface 451 of the first material 402 to the top surface 407 of the second layer. Distance D4 is equivalent to second height H2 of the lower portion 111b of the overhang structure 110. The first distance D3 is larger than the second distance D4.

At operation 306, as shown in FIG. 4F (along the pixel plane), a photoresist 408 is disposed over the anodes 104 and a portion of the well 105. An opening 410 is formed in the photoresist 408 over a center portion of the well 105. The opening 410 exposes a middle portion of the second material 404. The opening 410 is in a range of about 100 nm to about 500 nm, such was in a range of about 200 nm to about 300 nm.

At operation 307, as shown in FIG. 4G (along the line plane), a first etching process E1 is performed. The first etching process E1 is the first step in a three step reactive ion etching (REI) process. During the first etching process E1 an aluminum oxide ($Al_2O_3$) chlorine (Cl) based dry etch is used to widen opening 410 formed in the photoresist. The first etching process E1 is an anisotropic process. The second material 404 is slightly etched into as well.

At operation 308, as shown in FIG. 4H (along the pixel plane) a second etching process E2 is performed. The second etching process E2 is the second step in a three step reactive ion etching (REI) process. During the second etching process E2 an etchant is used vertically etch a channel 412 through the second material 404 and into the first material 402. The etchant includes etchants such as a silicon monoxide (SiO) fluorine (F) based dry etch. The second etching process E2 is an anisotropic process. The second etching process E2 vertically etches into the channel 412 first material 402. The etching process E2 is stopped before channel 412 reaches the protective layer 106. The channel 412 has a width within a range of about 200 nm to about 500 nm such as a width within a range of about 250 nm to about 400 nm.

At operation 309, as shown in FIG. 4I (along the pixel plane) a third etching process E3 is performed. The third etching process E3 is the third step in a three step reactive ion etching (REI) process. During the third etching process E3 an etchant is used selectively etch the first material 402. The first material 402 is formed of the first composition with the first etch rate. The second material 404 is formed of the second composition having the second etch rate. The different etch rates of the first composition and the second composition causes the first material 402 to be widened greater rate than the second material 404 during the third etching process. The channel 412 in the first material 402 is widened during the third etching process E3. The etchant includes etchants such as silver (Ag) potassium (KI) based wet etchant, or silver (Ag) iodine ($I_2$) based wet etchant.

The third etching process E3 is an isentropic process. The third etching process selectively etched the first material 402, while avoiding etching into the second material 404 and the protective layer 106. The third etching process E3 forms adjacent the overhang structures 110a, 110b within the well 105. The adjacent overhang structures 110a, 110b define the trench area 152. After the third etching process E3 is performed the lower sidewalls 131 of the adjacent overhang structures 110 within the well 105 are separated by a distance D1. After the third etching process E3 is performed the The upper sidewalls 133 of the adjacent overhang structures 110 within a well 105 are separated by a distance D2. At operation 310, as shown in FIG. 4J (along the pixel plane) the photoresist 408 is removed and a portion of the protective layer 106 disposed over the anodes 104 is removed. The portion of the protective layer 106 disposed over the upper surface of the anodes 104 can be removed using a hydrogen fluoride (HF) wet etch. Alternatively, the protective layer 106 disposed over the upper surface of the anodes 104 can be removed using an OLED $O_2$ based plasma ashing process. After operation 310 is performed, a portion middle of the upper surface of the anodes 104 is exposed, while an outer portion of the upper surface of the anodes 104 remains covered by the upper portion 106a of the protective layer 106.

At operation 311, as shown in FIG. 4K (along pixel plane), the first OLED material 112 of the first sub-pixel line 107A and the first cathode 114 are deposited. The first OLED material 112 includes an HIL material. The shadowing of the adjacent overhang extensions 109 within the trench area 152 provides for an electrical break in the OLED material 112 and the cathode 114. The first OLED material 112 and the first cathode 114 may separate (e.g., may be non-continuous) along the pixel plane. The first OLED material 112 and first cathode 114 maintain continuity along the line plane, e.g., the first OLED material 112 and the first cathode 114 are disposed over the separations structures 125. The total thickness of the first OLED material 112 and the first cathode 114 is from about 100 nm to about 150 nm.

At operation 312, as shown in FIG. 4L (along the pixel plane), a protective photoresist 416 is deposited over the first sub-pixel line 107A. The protective photoresist 416 extends over the anode 104 and the first overhang structure 110a within the first sub-pixel line 107A. The protective photoresist 416 extends into the opening 115 of the trench area 152. The protective photoresist covers the first OLED material 112 and the first cathode 114 disposed over the first overhang structure 110a and protects a portion of the first OLED material 112 and the first cathode 114 within the well 105. The protective photoresist does not cover the first OLED material 112 and the first cathode 114 disposed over the second overhang structure 110b.

At operation 313, as shown in FIG. 4M (along the pixel plane), the first OLED material 112 and the first cathode 114 disposed over the second sub-pixel line 107B is etched away. The first OLED material 112 and the first cathode 114 protected by the protective photoresist 416 is protected during the etching process. After the etching process is completed, the protective photoresist 416 is removed and the first OLED material 112 and the first cathode 114 that was covered by the protective photoresist 416 during the etching process remains.

At operation 314, as shown in FIG. 4N (along pixel plane), a second OLED material 112' of the second sub-pixel line 107B and a second cathode 114' of the second sub-pixel line 107B are deposited. The second OLED material 112' includes an HIL material. The shadowing of the adjacent overhang extensions 109 provides within the trench area 152 provides for an electrical break in the second OLED material 112' and the second cathode 114'. The second OLED material 112' and the second cathode 114' may separate (e.g., may be non-continuous) along the pixel plane. The second OLED material 112' and second cathode 114' maintain continuity along the line plane, e.g., the second OLED material 112' and the second cathode 114' are disposed over the separations structures 125. The total thickness of the second OLED material 112' and the second cathode 114' is from about 100 nm to about 150 nm.

At operation 315, as shown in FIG. 4O (along the pixel plane), a protective photoresist 416 is deposited over the second sub-pixel line 107B. The protective photoresist 416 extends over the anode 104 and the second overhang structure 110b within the second sub-pixel line 107B. The protective photoresist 416 extends into the opening 115 of the trench area 152. The protective photoresist covers the second OLED material 112' and the second cathode 114' disposed over the second overhang structure 110b and protects a portion of the second OLED material 112' and the second cathode 114' within the trench area 152. The protective photoresist does not cover the second OLED material 112' and the second cathode 114' disposed over the first overhang structure 110a and the first sub-pixel line 107A.

At operation 316, as shown in FIG. 4P (along the pixel plane), the second OLED material 112' and the second cathode 114' of the second sub-pixel line 107B, disposed over the first sub-pixel line 107A is etched away. The second OLED material 112' and the second cathode 114' disposed over the first sub-pixel line is etched away so that the cathode 114 of the first sub-pixel line 107A is exposed. The second OLED material 112' and the second cathode 114' of the second sub-pixel line 107B protected by the protective photoresist 416 is protected during the etching process. After the etching process is completed, the protective photoresist 416 is removed and the second OLED material 112' and the second cathode 114' that was covered by the protective photoresist during 416 the etching process remains. After the photoresist is removed, the first sub-pixel line 107A includes the first OLED material 112 and the first cathode 114 of the first sub-pixel line 107A, and the second sub-pixel line 107B includes the second OLED material 112' and the second cathode 114' of the second sub-pixel line 107B.

At operation 317, as shown in FIG. 4Q (along the pixel plane), an encapsulation layer 116 is deposited over the sub-pixel lines 107A, 107B. The encapsulation layer 116 extends over the cathodes 114, 114' disposed over the anode 104, and the overhang structures 110. The encapsulation layer extends into the wells 105 and contacts a bottom surface of the overhang extension 109, as well as a sidewall of the first portion 111a. Additionally, the encapsulation layer is disposed over the OLED materials 112, 112' and the cathodes 114, 114' within the trench area 152. The encapsulation layer 116 includes the non-conductive inorganic material, such as the silicon-containing material. The silicon-containing material may include $Si_3N_4$ containing materials. In one or more embodiments, a global encapsulation layer 118 may optionally be disposed over the encapsulation layer 116. The global encapsulation layer 118 layer fills the openings 115 of the trench area 152 and covers the entirety of the sub-pixel circuit 100.

Benefits of the present disclosure include increased pixels-per-inch, decreased current leakage, increased device performance, increased device image resolution, decreased cost, and decreased maintenance.

It is contemplated that one or more aspects disclosed herein may be combined. As an example, one or more aspects, features, components, operations and/or properties of the sub-pixel circuit 100, the substrate 102, the anode 104, the protective layer 106, the OLED material 112, the cathode 114, the encapsulation layer 116, the global encapsulation layer 118, the wells 105, the overhang structures 110, the first portion 111a, the second portion 111b, the opening 115, the sub-pixel lines 107A, 107B, 107C, the sub-pixels 108A, 108B, 108C, 108D, 108E, 108F, the busbars 150, and/or method 300 may be combined. Moreover, it is contemplated that one or more aspects disclosed herein may include some or all of the aforementioned benefits.

While the foregoing is directed to embodiments of the present disclosure, other and further embodiments of the disclosure may be devised without departing from the basic scope thereof, and the scope thereof is determined by the claims that follow.

What is claimed is:

1. A sub-pixel circuit, comprising:
   at least two anodes disposed over a substrate, the anodes having an anode thickness from the substrate to an uppermost surface of the anode, adjacent anodes defining a well;
   adjacent overhang structures, the overhang structures comprising a first portion disposed in the well and overhang extensions extending past lower sidewalls of the first portion, wherein the well has a trench area defined by the lower sidewalls and a bottom surface of the overhang extensions with a gap between the overhang extensions of the adjacent overhang structures;
   an organic light emitting diode (OLED) material disposed over the anode, the upper surface of the overhang structures, under the overhang extensions, and within the trench area;
   a cathode disposed over the OLED material; and
   an encapsulation layer disposed over the cathode.

2. The sub-pixel circuit of claim 1, wherein the overhang structures further comprise a second portion, wherein the first portion comprises a first material and the second portion comprises a second material.

3. The sub-pixel circuit of claim 2, wherein the first material and the second material are different.

4. The sub-pixel circuit of claim 2, wherein the first material has a first etch rate and the second material has a second etch rate when exposed to an etchant.

5. The sub-pixel circuit of claim 4, wherein the first etch rate and the second etch rate are different.

6. The sub-pixel circuit of claim 1, wherein the cathode is disposed over the upper surface of the overhang structures, under the overhang structures, and within the trench area.

7. The sub-pixel circuit of claim 2, wherein the encapsulation layer extends under at least a portion of the second portion along a lower sidewall of the first portion, and contacts the bottom surface of the overhang extensions of the overhang structures.

8. The sub-pixel circuit of claim 1, wherein the OLED material is disposed on the substrate within the trench area.

9. The sub-pixel circuit of claim 1, further comprising a protective layer disposed on the substrate within the well and extending over at least a portion of the anodes.

10. The sub-pixel circuit of claim 1, wherein the OLED material disposed within the trench area contacts the lower sidewalls of the adjacent overhang structures.

11. The sub-pixel circuit of claim 1, wherein a first thickness of the OLED material disposed over the anodes and the upper surface of the overhang structures is larger than a second thickness of the OLED material disposed within the trench area.

12. The sub-pixel circuit of claim 2, wherein the first material comprises silicon.

13. The sub-pixel circuit of claim 2, wherein the second material comprises silicon oxide.

14. The sub-pixel circuit of claim 2, further comprising:
   a global encapsulation layer disposed over the encapsulation layer.

15. The sub-pixel circuit of claim 14, wherein the global encapsulation layer fills the trench area and the gap between the second portion of the adjacent overhang structures.

16. A device, comprising:
   a first sub-pixel and a second sub-pixel each comprising:
      anodes disposed over a substrate;
      a plurality of overhang structures disposed over the substrate alongside opposite sidewalls of the anodes, the plurality of overhang structures comprising:
         a first portion comprising a first material, the first portion further comprising a lower sidewall;
         second portion disposed over at least a portion of the first portion, the second portion comprising a second material, the second portion further comprising an overhang extension extending past the lower sidewall, wherein the lower sidewall of the first portion and a bottom surface of the overhang extension of the second portion partially define a trench area;

an organic light emitting diode (OLED) material disposed over the anode, an upper surface of the overhang structures under the overhang extension, and within the trench area;

a cathode disposed over the OLED material; and an encapsulation layer disposed over the cathode.

17. The device of claim 16, wherein the first material has a first etch rate and the second material has a second etch rate.

18. The device of claim 17, wherein the first etch rate and the second etch rate are different.

19. The device of claim 16, wherein the cathode is disposed over the upper surface of the overhang structures, under the overhang structures, and within the trench area.

20. The device of claim 16, wherein the encapsulation layer extends under at least a portion of the second portion along the lower sidewall of the first portion, and contacts the bottom surface of the overhang extension of the overhang structures.

21. The device of claim 16, wherein the OLED material is disposed on the substrate within the trench area.

22. The device of claim 16, further comprising a protective layer disposed on the substrate within the trench area and extending over at least a portion of the anodes.

23. The device of claim 16, wherein the OLED material disposed within the trench area contacts the lower sidewall of the overhang structures.

24. The device of claim 16, wherein a first thickness of the OLED material disposed over the anodes and the upper surface of the overhang structures is larger than a second thickness of the OLED material disposed within the trench area.

25. The device of claim 16, wherein the first material comprises silicon.

26. The device of claim 16, wherein the second material comprises silicon oxide.

27. The device of claim 16, further comprising:

a global encapsulation layer disposed over the encapsulation layer.

28. The device of claim 27, wherein the global encapsulation layer fills the trench area.

29. A sub-pixel circuit, comprising:

a plurality of anodes disposed over a substrate, adjacent anodes defining a well;

adjacent overhang structures disposed in the well, the adjacent overhang structures comprising:

a first portion, the first portion comprising a lower sidewall;

a second portion disposed over at least a portion of the first portion, the second portion comprising an overhang extension extending past the lower sidewall, wherein the well has a trench area defined by the lower sidewall of the first portion and a bottom surface of the overhang extension of the second portion with a gap between the second portions of the adjacent overhang structures;

an organic light emitting diode (OLED) material disposed over the anode, an upper surface of the overhang structures, under the overhang structures extension, and within the trench area;

a cathode disposed over the OLED material disposed over the upper surface of the overhang structures, under the overhang structures, and within the trench area; and an encapsulation layer disposed over the cathode, wherein the encapsulation layer extends under at least a portion of the second portion along the lower sidewall of the first portion, and contacts the bottom surface of the overhang extension of the overhang structures.

30. The sub-pixel circuit of claim 29, wherein the first portion further comprises first material having a first etch rate, and the second portion further comprises a second material having a second etch rate, wherein the second material is different than the first material.

* * * * *